US012813108B2

(12) United States Patent
Li et al.

(10) Patent No.: US 12,813,108 B2
(45) Date of Patent: Nov. 24, 2026

(54) DISPLAY PANELS INCLUDING PARTITIONS LOCATED IN NON-LIGHT EMITTING AREA AND DISPLAY DEVICES

(71) Applicant: WUHAN CHINA STAR OPTOELECTRONICS SEMICONDUCTOR DISPLAY TECHNOLOGY CO., LTD., Wuhan (CN)

(72) Inventors: Xiaokang Li, Wuhan (CN); Haijun Yu, Wuhan (CN); Yu Gu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 527 days.

(21) Appl. No.: 18/549,919

(22) PCT Filed: Jul. 19, 2023

(86) PCT No.: PCT/CN2023/108079
§ 371 (c)(1),
(2) Date: Sep. 10, 2023

(87) PCT Pub. No.: WO2024/254937
PCT Pub. Date: Dec. 19, 2024

(65) Prior Publication Data
US 2025/0098444 A1 Mar. 20, 2025

(30) Foreign Application Priority Data
Jun. 15, 2023 (CN) ......................... 202310716146.5

(51) Int. Cl.
*H10K 59/131* (2023.01)

(52) U.S. Cl.
CPC ................................. *H10K 59/131* (2023.02)

(58) Field of Classification Search
CPC ................................................... H10K 59/131
See application file for complete search history.

(56) References Cited

U.S. PATENT DOCUMENTS 9,960,216 B2 * 5/2018 Lee .................. H10K 59/80522
2009/0009069 A1 * 1/2009 Takata ................ H10K 59/122
445/24

(Continued)

FOREIGN PATENT DOCUMENTS

CN 104112762 A 10/2014
CN 114628449 A 6/2022

(Continued)

OTHER PUBLICATIONS

International Search Report in International application No. PCT/CN2023/108079,mailed on Feb. 2, 2024.
Written Opinion of the International Search Authority in International application No. PCT/CN2023/108079,mailed on Feb. 2, 2024.

(Continued)

*Primary Examiner* — Lex H Malsawma
(74) *Attorney, Agent, or Firm* — PV IP PC; Christopher S. Ruprecht; Wei Te Chung

(57) ABSTRACT

Display panels and display devices are provided. The display panel includes a substrate, a pixel definition layer, a light emitting layer, and partitions. The pixel definition layer includes first grooves and second grooves arranged in a non-light emitting area. Each partition includes a first portion and a second portion connected to each other. The first portion corresponds to the second groove. A width of the second portion is greater than a width of the first portion. The second portion is spaced apart from a surface of the pixel definition layer away from the substrate.

20 Claims, 35 Drawing Sheets

(56) References Cited

U.S. PATENT DOCUMENTS

| | | | | |
|---|---|---|---|---|
| 2010/0097295 | A1* | 4/2010 | Kwak | H10K 59/8792 345/32 |
| 2014/0183479 | A1* | 7/2014 | Park | H10K 59/1315 438/34 |
| 2014/0183501 | A1* | 7/2014 | Kim | H10K 59/122 438/34 |
| 2014/0312323 | A1* | 10/2014 | Park | H10K 59/80516 438/23 |
| 2016/0149156 | A1* | 5/2016 | Kim | H10K 59/121 438/46 |
| 2016/0190228 | A1* | 6/2016 | Park | H10K 59/1315 257/40 |
| 2021/0126081 | A1* | 4/2021 | Moon | H10K 59/131 |
| 2022/0013603 | A1* | 1/2022 | Kim | H10K 59/352 |
| 2022/0262878 | A1* | 8/2022 | Lee | H10K 59/122 |
| 2022/0310721 | A1* | 9/2022 | Ma | H10K 59/122 |
| 2024/0164144 | A1* | 5/2024 | Zhang | H10K 59/80521 |
| 2024/0215330 | A1* | 6/2024 | Cheng | H10K 59/00 |

FOREIGN PATENT DOCUMENTS

| | | | |
|---|---|---|---|
| CN | 114628451 | A | 6/2022 |
| DE | 102018129156 | A1 | 6/2019 |
| JP | 2004071365 | A | 3/2004 |
| JP | 2008135325 | A | 6/2008 |
| KR | 20230062507 | A | 5/2023 |
| WO | 2020087852 | A1 | 5/2020 |

OTHER PUBLICATIONS

German Office Action issued in corresponding German Patent Application No. 11 2023 000 065.4 dated Feb. 5, 2024, pp. 1-9.

* cited by examiner

DISPLAY PANELS INCLUDING PARTITIONS LOCATED IN NON-LIGHT EMITTING AREA AND DISPLAY DEVICES

CROSS-REFERENCE TO RELATED APPLICATION

This application is a national stage of International Application No. PCT/CN2023/108079, filed on Jul. 19, 2023, which claims priority to Chinese Patent Application No. 202310716146.5, filed on Jun. 15, 2023. The aforementioned applications are herein incorporated by references in their entireties.

TECHNICAL FIELD

The present disclosure relates to the field of display technologies, and in particular, to display panels and display devices.

BACKGROUND

With the continuous development of the display technology, organic light emitting diodes (OLEDs) have gradually become the mainstream in the display field due to their excellent properties such as self-illumination, high contrast, wide viewing angle, low power consumption, and bendability. An OLED element in a display panel is composed of an anode, a light emitting layer, and a cathode. Part of film layers of the light emitting layer are formed by evaporation with an open mask, which may reduce the use of a fine metal mask (FMM) to save manufacturing costs, but a common film layer will inevitably generate lateral leakage between adjacent pixels, resulting in the problem of mis-lighting of pixels, which affects the effect of screen display.

Therefore, there is an urgent need for display panels and display devices to solve the above technical problem.

SUMMARY OF THE INVENTION

The present disclosure provides display panels and display devices to alleviate the technical problem of mis-lighting of pixels which affects the effect of screen display.

In order to solve the above problem, technical solutions provided by the present disclosure are as follows:

Display panels are provided according to embodiments of the present disclosure. The display panel includes a plurality of light emitting areas arranged at intervals and a non-light emitting area located between the light emitting areas, and the display panel includes:

- a substrate;
- a pixel definition layer, disposed on a side of the substrate, and comprising first grooves correspondingly disposed in the light emitting areas and second grooves disposed in the non-light emitting area;
- a plurality of partitions, disposed in the non-light emitting area and on a side of the pixel definition layer away from the substrate, wherein each of the partitions comprises a first portion disposed corresponding to one of the second grooves and a second portion disposed on a side of the first portion away from the substrate, a width of the second portion is greater than a width of the first portion, and the second portion is spaced apart from a surface of the pixel definition layer away from the substrate; and
- a light emitting layer, disposed on the side of the pixel definition layer and sides of the partitions away from the substrate, wherein the light emitting layer comprises pixels disposed corresponding to the first grooves, the light emitting layer comprises pixels a plurality of sub-film layers stacked, and at least part of the sub-film layers of the light emitting layer are disconnected at the partitions.

In some embodiments, a sidewall of the first portion is arranged in contact with the pixel definition layer.

In some embodiments, the display panel further includes a first layer disposed in the non-light emitting area, the first layer is disposed between the surface of the pixel definition layer away from the substrate and the second portion, and is disposed adjacent to the first portion.

In some embodiments, an end of the light emitting layer on a side of the partitions is spaced apart from the first layer.

In some embodiments, the display panel further includes a first layer disposed in the non-light emitting area, and the first layer is disposed at least between a sidewall of the first portion and a sidewall of a corresponding one of the second grooves.

In some embodiments, the first layer the first layer is further disposed between a bottom surface of the first portion and a bottom surface of the corresponding one of the second grooves.

In some embodiments, the first layer further extends between the surface of the pixel definition layer away from the substrate and the second portion, and an end of the light emitting layer on a side of the partitions is spaced apart from the first layer.

In some embodiments, the light emitting layer includes a first light emitting sublayer, a second light emitting sublayer disposed on a side of the first light emitting sublayer away from the substrate, and a charge generation layer disposed between the first light emitting sublayer and the second light emitting sublayer; herein, the charge generation layer is disconnected at the partitions.

In some embodiments, the display panel further includes an anode layer and a cathode layer, the anode layer is disposed on a side of the light emitting layer adjacent to the substrate, and the cathode layer is disposed on a side of the light emitting layer away from the substrate; herein, the cathode layer is disconnected at the partitions.

In some embodiments, the display panel further includes: a driving circuit layer, disposed between the substrate and the pixel definition layer; and a planarization layer, disposed between the driving circuit layer and the pixel definition layer; herein, each of the second grooves runs through the pixel definition layer, and the first portion is arranged in contact with the planarization layer.

In some embodiments, each of the partitions further comprises a third groove located on a side of the second portion away from the substrate, and the third groove is filled with at least part of the sub-film layers of the light emitting layer therein.

In some embodiments, the at least part of the sub-film layers of the light emitting layer are disconnected in the third groove.

In some embodiments, the third groove runs through the second portion and the first portion.

In some embodiments, the second portion comprises a first surface adjacent to the first portion and a second surface facing away from the first portion, and an orthographic projection of the first surface on the substrate is located within an orthographic projection of the second surface on the substrate.

In some embodiments, an outer contour of the orthographic projection of the first surface on the substrate is spaced apart from an outer contour of the orthographic projection of the second surface on the substrate.

In some embodiments, at least one of the second grooves is provided between two adjacent ones of the light emitting areas, and there is at least some of the second grooves each extending along a periphery of an adjacent one of the light emitting areas.

In some embodiments, at least one of the pixels is surrounded by some of the second grooves arranged in a closed loop.

Embodiments of the present disclosure also provide display devices. The display device includes a display panel, the display panel includes a plurality of light emitting areas arranged at intervals and a non-light emitting area disposed between the light emitting areas, and the display panel includes:

a substrate;

a pixel definition layer, disposed on a side of the substrate, and comprising first grooves correspondingly disposed in the light emitting areas and second grooves disposed in the non-light emitting area;

a plurality of partitions, disposed in the non-light emitting area and on a side of the pixel definition layer away from the substrate, wherein each of the partitions comprises a first portion disposed corresponding to one of the second grooves and a second portion disposed on a side of the first portion away from the substrate, a width of the second portion is greater than a width of the first portion, and the second portion is spaced apart from a surface of the pixel definition layer away from the substrate; and a light emitting layer, disposed on the side of the pixel definition layer and sides of the partitions away from the substrate, wherein the light emitting layer comprises pixels disposed corresponding to the first grooves, the light emitting layer comprises pixels a plurality of sub-film layers stacked, and at least part of the sub-film layers of the light emitting layer are disconnected at the partitions.

In some embodiments, a sidewall of the first portion is arranged in contact with the pixel definition layer.

In some embodiments, the display panel further comprises a first layer disposed in the non-light emitting area, and the first layer is disposed at least between a sidewall of the first

Beneficial Effects

In the present disclosure, the partitions are provided in the non-light emitting area, the first portion of the partition is arranged corresponding to the second groove, the second portion of the partition is wider than the first portion, and the second portion of the partition is spaced from the pixel definition layer. It is beneficial for the disconnection of at least part of the sub-film layers of the light emitting layer at the side of the second portion, thereby reducing the leakage paths of the leakage current and reducing the risk of mis-lighting of pixels.

EMBODIMENTS OF THE INVENTION

Figure 1:
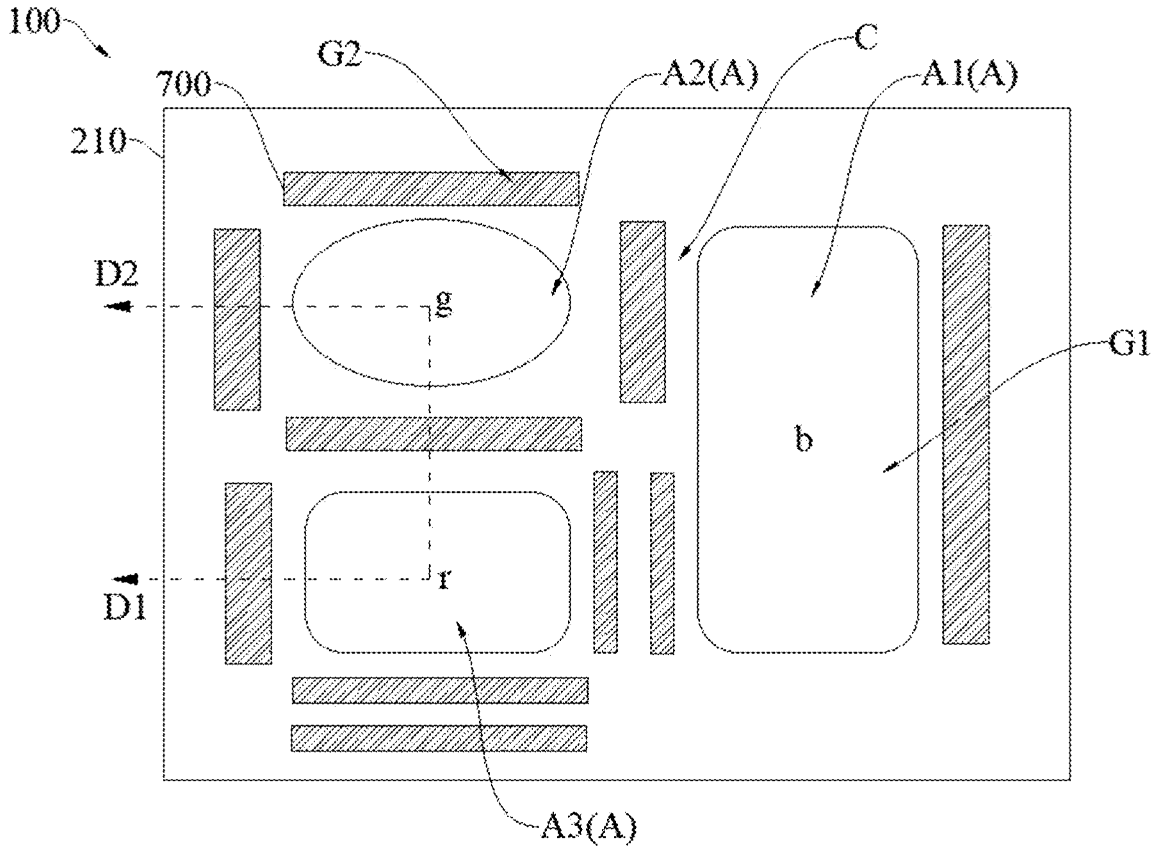
FIG. 1 is a schematic top view of a first structure of a display panel provided according to an embodiment of the present disclosure.

Display panels and display devices are provided in the present disclosure. In order to make the purpose, technical solutions, and effect of the present disclosure clearer, the present disclosure will be further described in detail below with reference to the accompanying drawings and examples. It should be understood that the specific embodiments described here are only used to explain the present disclosure, not intended to limit the present disclosure.

Embodiments of the disclosure provide display panels and display devices. Each will be described in detail below. It should be noted that the description sequence of the following embodiments is not intended to limit the preferred sequence of the embodiments.

Referring to FIG. 1 to FIG. 16, embodiments of the present disclosure provide a display panel 100, which includes a plurality of light emitting areas A arranged at intervals and a non-light emitting area C disposed between the light emitting areas A. The display panel 100 includes:

a substrate 210;

a pixel definition layer 300, disposed on the substrate 210, and including first grooves G1 disposed corresponding to the light emitting areas A and second grooves G2 disposed in the non-light emitting area C;

a plurality of partitions 700, disposed in the non-light emitting area C and on a side of the pixel definition layer 300 away from the substrate 210; herein, each of the partitions 700 includes a first portion 710 corresponding to the second groove G2 and a second portion 720 disposed on a side of the first portion 710 away from the substrate 210, a width of the second portion 720 is greater than a width of the first portion 710, and the second portion 720 is spaced apart from a surface of the pixel definition layer 300 away from the substrate 210; and a light emitting layer 400, disposed on the side of the pixel definition layer 300 and sides of the partitions 700 away from the substrate 210; herein, the light emitting layer 400 includes pixels disposed corresponding to the first grooves G1, the light emitting layer 400 includes a plurality of sub-film layers stacked, and at least part of the sub-film layers of the light emitting layer 400 are disconnected at the partitions 700.

In the present disclosure, partitions are provided in the non-light emitting area, the first portion of the partition is arranged in the second groove, the second portion of the partition is wider than the first portion, and the second portion of the partition is spaced apart from the pixel definition layer. It is beneficial for the disconnection of at least part of the sub-film layers of the light emitting layer at the side of the second portion, thereby reducing the leakage paths of the leakage current and reducing the risk of mis-lighting of pixels. At the same time, the second grooves are arranged in the non-light emitting area, and the first portion of the partition is arranged in the second groove, which reduces an overall height of the partition, improves the leveling of organic film layers of the encapsulation layer, and improves the packaging performance, so that it may also ensure better package reliability while effectively improving the poor display caused by mis-lighting of pixels.

The technical solutions of the present disclosure will now be described in conjunction with specific embodiments.

Figure 2:
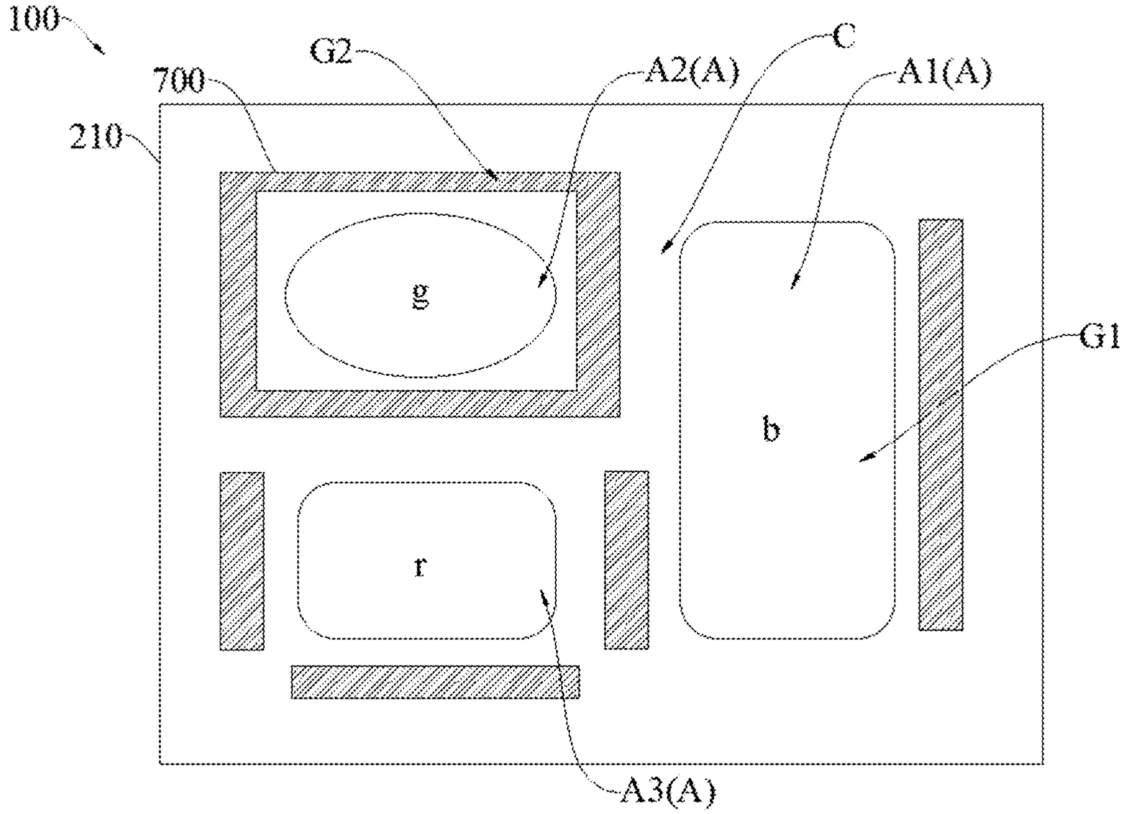
FIG. 2 is a schematic top view of a second structure of a display panel provided according to an embodiment of the present disclosure.
Figure 3:
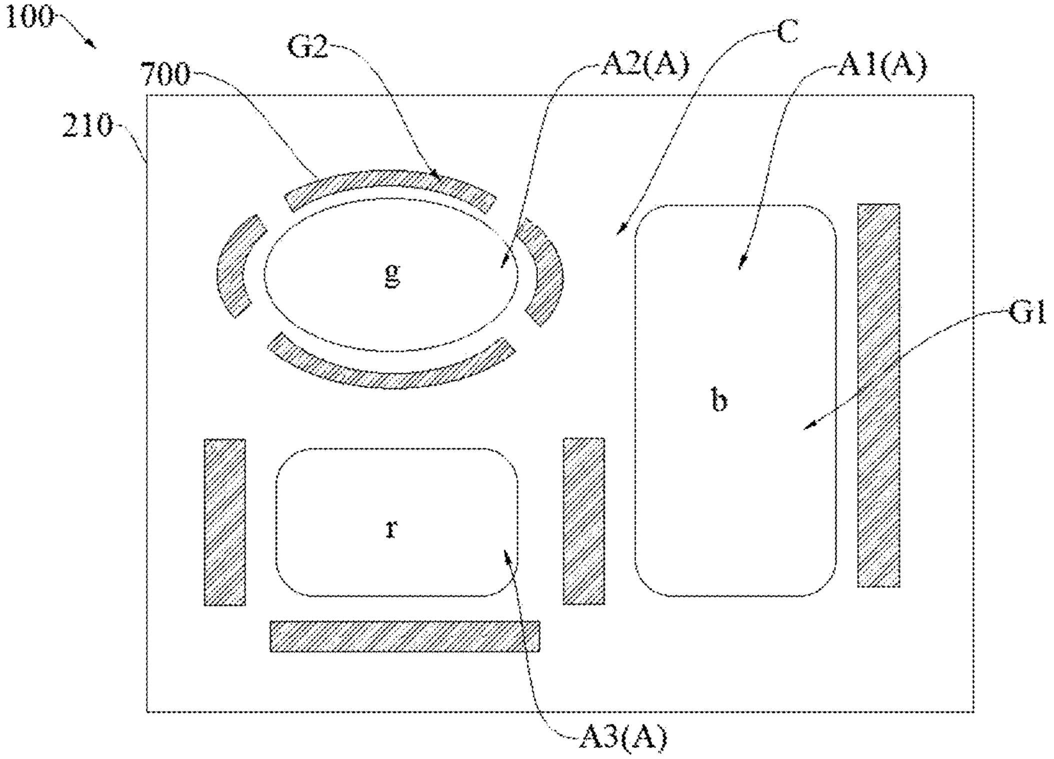
FIG. 3 is a schematic top view of a third structure of a display panel provided according to an embodiment of the present disclosure.

In the embodiments, referring to FIG. 1 to FIG. 3, the display panel 100 includes a display area, and the display area includes the plurality of light emitting areas A arranged at intervals and the non-light emitting area C between the plurality of light emitting areas A. The light emitting areas A refer to areas where the display panel 100 actually emits light when displaying, and are configured to arrange light emitting units. The non-light emitting area C refers to an area where the display panel 100 remains in a black state when displaying, and is configured to arrange necessary structures such as circuits and wirings that driving the light emitting units. The plurality of light emitting areas A include first-color light emitting areas A1 each for arranging a first-color light emitting unit, second-color light emitting areas A2 each for arranging a second-color light emitting unit, and third color light emitting areas A3 each for arranging a third color light emitting unit. For example, the first color is blue, the second color is green, and the third color is red. Each light emitting area A corresponds to one pixel, the first-color light emitting area A1 corresponds to a blue pixel b, the second-color light emitting area A2 corresponds to a green pixel g, and the third-color light emitting area A3 corresponds to a red pixel r. The pixels may be represented by any of labels r, g, and b, which will not be described in detail below.

Figure 4:
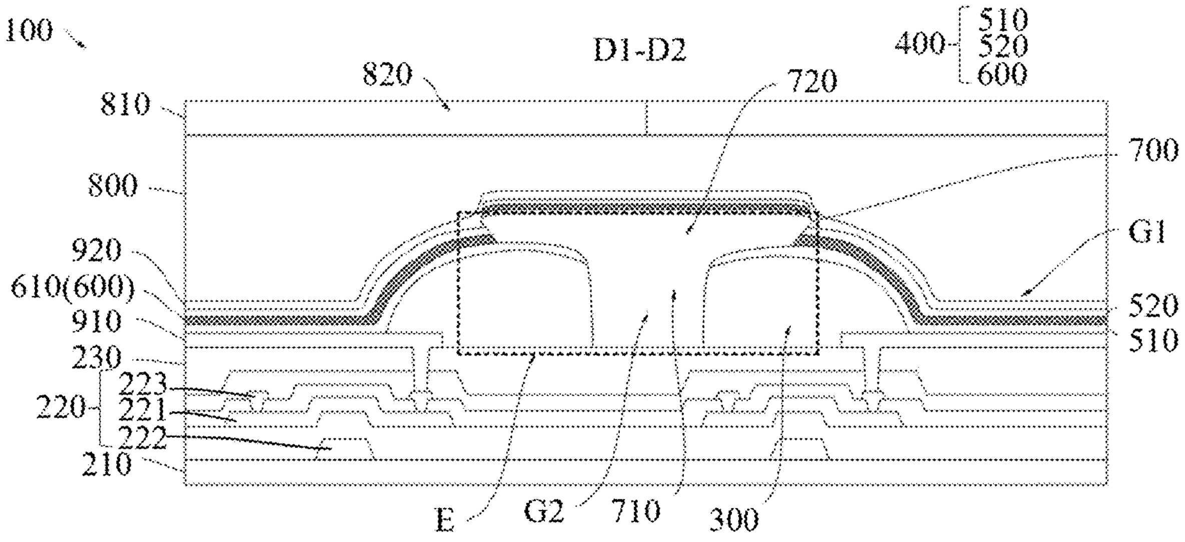
FIG. 4 is a schematic view of a first sectional structure along D1-D2 in FIG. 1.

Referring to FIG. 4, the display panel 100 includes the substrate 210, and an anode layer 910, the pixel definition layer 300, the light emitting layer 400, a cathode layer 920, and an encapsulation layer 800 disposed on the substrate 210.

Specifically, referring to FIG. 4, the anode layer 910 includes a plurality of anodes corresponding to the plurality of light emitting areas A. The pixel definition layer 300 is disposed on the substrate 210, and includes a plurality of first grooves G1 disposed corresponding to the plurality of light emitting areas A and second grooves G2 disposed in the non-light emitting area C. Each first groove G1 exposes a corresponding one of the anodes. The light emitting layer 400 is disposed on the pixel definition layer 300 and the anode layer 910. The cathode layer 920 is disposed on the light emitting layer 400. The encapsulation layer 800 is disposed on a side of the cathode layer 920 away from the substrate 210, that is, disposed on a side of the light emitting layer 400 away from the substrate 210 and sides of the partitions 700 away from the substrate 210.

Specifically, taking a tandem light emitting device as an example, the light emitting layer 400 includes a first light emitting sublayer 510, a second light emitting sublayer 520 disposed on a side of the first light emitting sublayer 510 away from the substrate 210, and a charge generation layer (CGL) 610 disposed between the first light emitting sublayer 510 and the second light emitting sublayer 520. The light emitting layer includes a common layer 600 which may include the charge generation layer 610.

Figure 5:
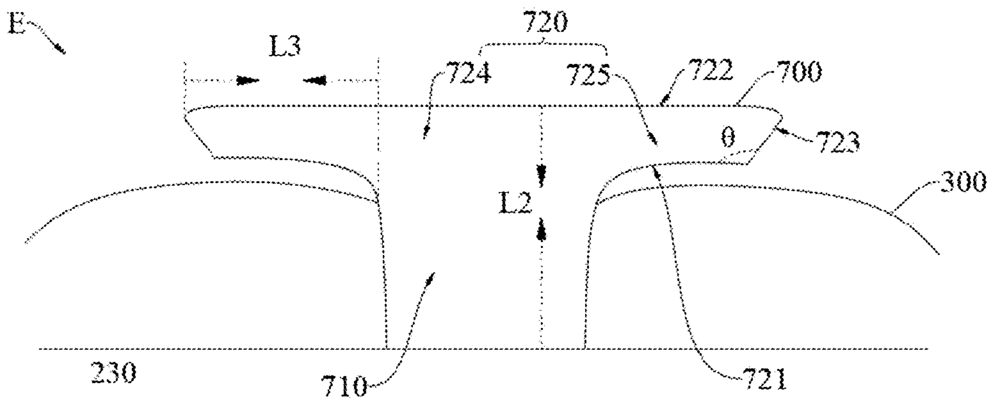
FIG. 5 is an enlarged schematic view of area E in FIG. 4.
Figure 6:
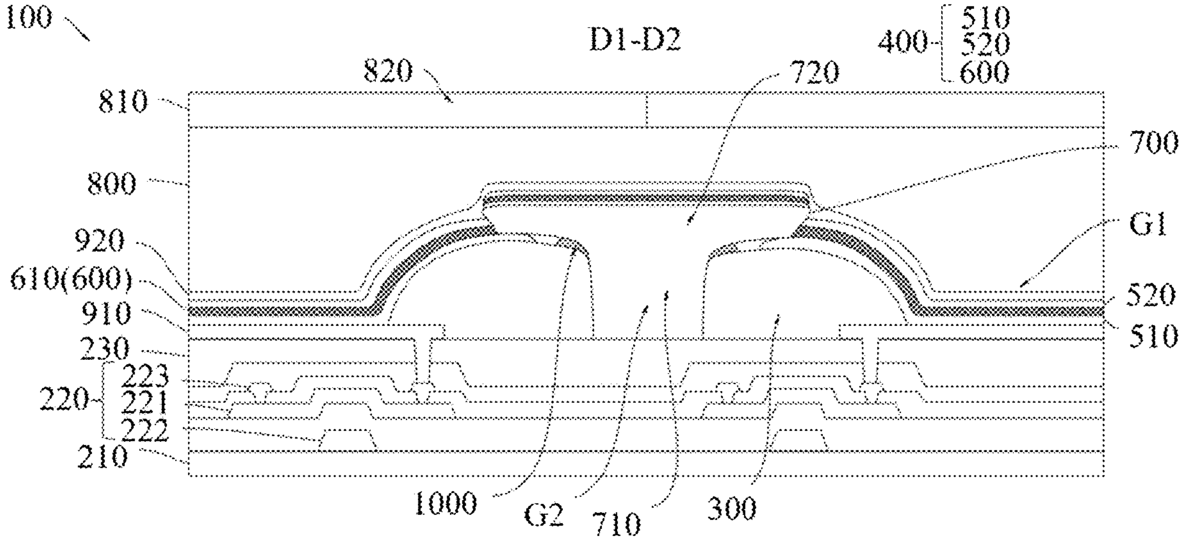
FIG. 6 is a schematic view of a second sectional structure along D1-D2 in FIG. 1.

Referring to FIG. 4, FIG. 5, and FIG. 6, the display panel 100 further includes partitions 700 disposed in the non-light emitting area C. Each partition 700 includes a first portion 710 disposed corresponding to the second groove G2 and a second portion 720 disposed on a side of the first portion 710 away from the substrate 210. A width of the second portion 720 is greater than a width of the first portion 710. The second portion 720 is spaced apart from a surface of the pixel definition layer 300 away from the substrate 210.

Specifically, referring to FIG. 5 and FIG. 6, the second portion 720 includes a first sub-portion 724 and a second sub-portion 725 disposed on a periphery of the first sub-portion 724. The first sub-portion 724 and the first portion 710 are connected. The second sub-portion 725 is spaced apart from the pixel definition layer 300.

Specifically, referring to FIG. 4, FIG. 5, and FIG. 6, there is at least one partition 700 having the second sub-portion 725 spaced apart from the pixel definition layer 300. When the light emitting layer 400 is formed, such as the charge generation layer 610, the second sub-portions 725 are in a suspended state, which increases the probability of the disconnection of the charge generation layer 610 at a side of the second sub-portion 725, and there is a greater probability of reducing the leakage paths of the leakage current, which reduces the risk of mis-lighting of pixels.

In some embodiments, referring to FIG. 4, FIG. 5, and FIG. 6, a sidewall of the first portion 710 is arranged in contact with the pixel definition layer 300. The sidewall of the first portion 710 is in direct contact with the pixel definition layer 300. An undercut structure is formed between the second portion 720 and the pixel definition layer 300 through a relatively simple manufacturing process, which increases the probability of the disconnection of at least part of the sub-film layers of the light emitting layer 400 at the side of the second sub-portion 725, which is more likely to reduce the leakage paths of the leakage current and reduces the risk of mis-lighting of pixels.

In some embodiments, referring to FIG. 13 to FIG. 16, the second portion 720 is disposed in contact with the surface of the pixel definition layer 300 away from the substrate 210. The second grooves are arranged in the non-light emitting area, and the first portion of the partition is arranged in the second groove, thereby reducing the overall height of the partition, improving the leveling of the organic film layers of the encapsulation layer, and improving the packaging performance, so that it may also ensure better package reliability while effectively improving the poor display caused by mis-lighting of pixels.

In some embodiments, referring to FIG. 6, the display panel 100 further includes a first layer 1000 located in the non-light emitting area C. The first layer 1000 is disposed between the surface of the pixel definition layer 300 away from the substrate 210 and the second portion 720, and is disposed close to the first portion 710.

During the manufacturing process, the first layer 1000 may be arranged between the surface of the pixel definition layer 300 away from the substrate 210 and the second portion 720 and close to the first portion 710 by adjusting etching process conditions, which is beneficial to have a better supporting effect on the second portion 720 and reduce a risk of the second portion being stuck.

Figure 7:
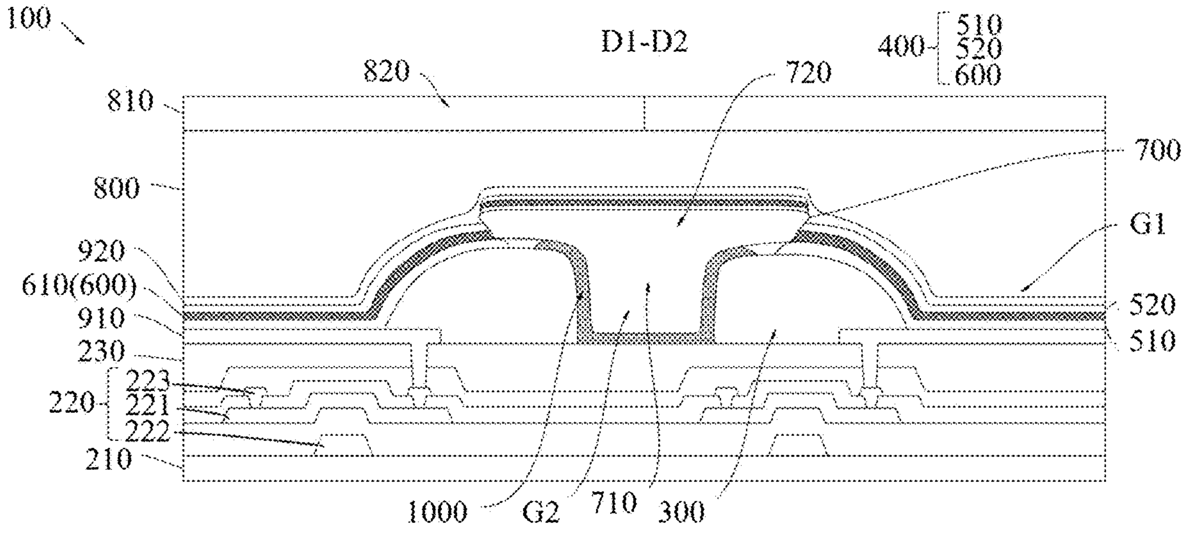
FIG. 7 is a schematic view of a third sectional structure along D1-D2 in FIG. 1.

In some embodiments, referring to FIG. 6 and FIG. 7, an end of the light emitting layer 400 on a side of the partition 700 is spaced apart from the first layer 1000.

A material of the first layer 1000 may include an inorganic material or a metal oxide material, and the metal oxide material may be a combination of any one or more of ITO, IZO, etc. At this time, the first layer 1000 may have conductivity. The light emitting layer 400 (for example, the first light emitting sublayer 510) is spaced apart from the first layer 1000 to avoid new leakage paths and reduce the risk of mis-lighting of pixels.

In some embodiments, referring to FIG. 7, the display panel 100 further includes a first layer 1000 located in the non-light emitting area C. The display panel 100 also includes the first layer 1000 located between the partitions 700 and the pixel definition layer 300. The first layer 1000 is disposed at least between a sidewall of the first portion 710 and a sidewall of the second groove G2.

Figure 20A:
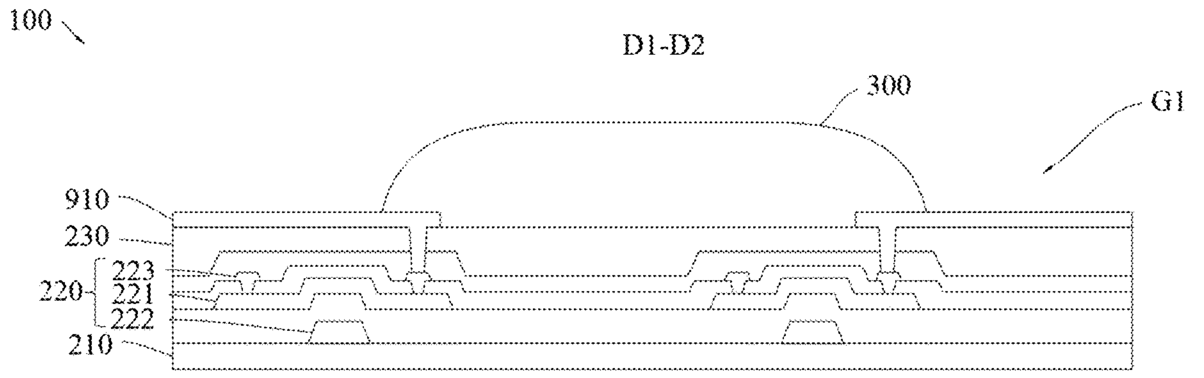
FIG. 20A to FIG. 20F are schematic views of second structures in steps of a manufacturing method of a display panel provided according to an embodiment of the present disclosure.
Figure 20B:
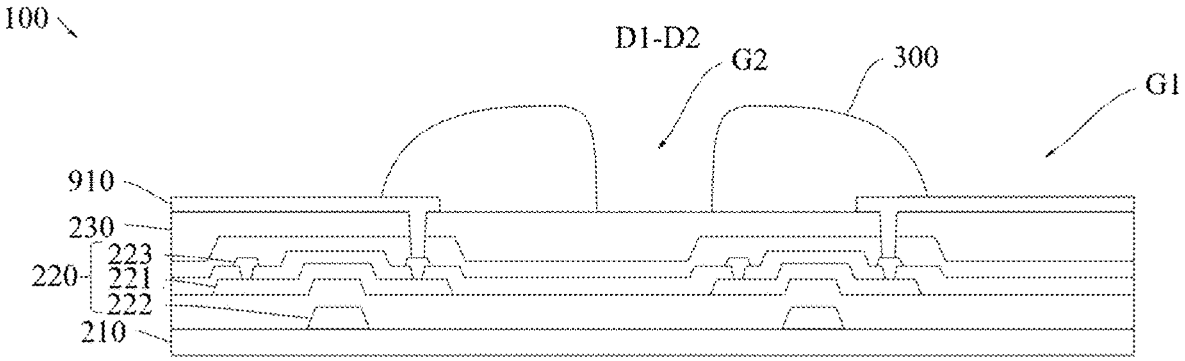
Figure 20C:
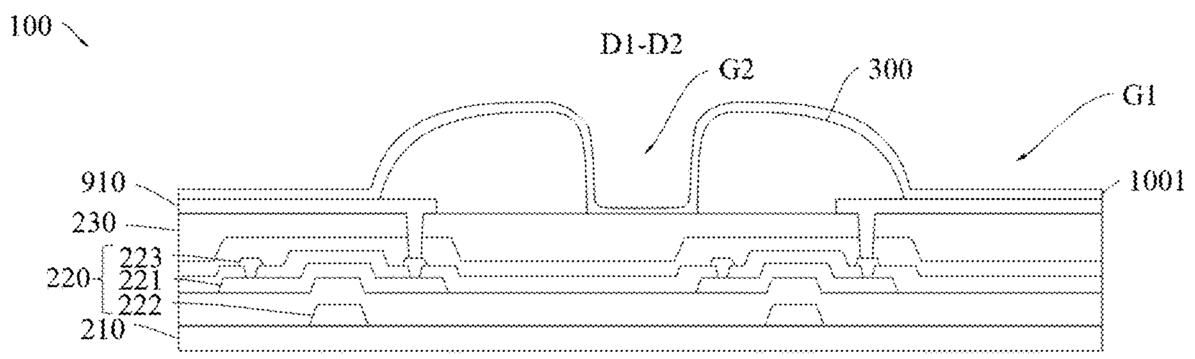
Figure 20D:
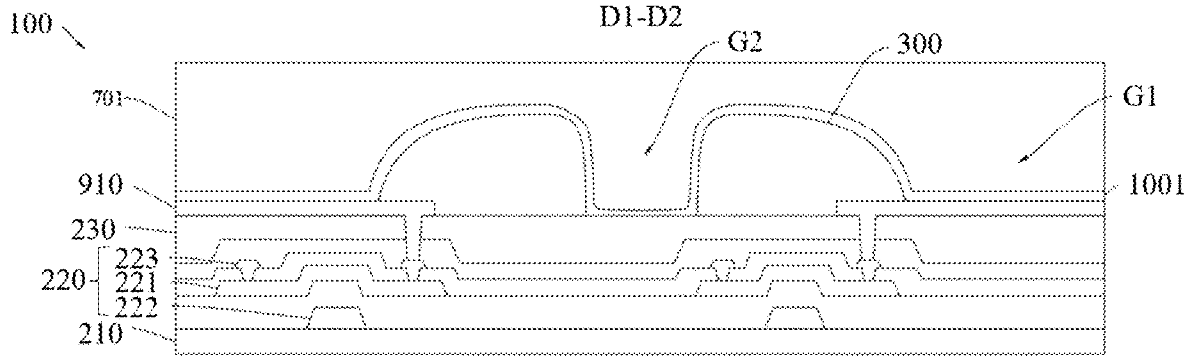
Figure 20E:
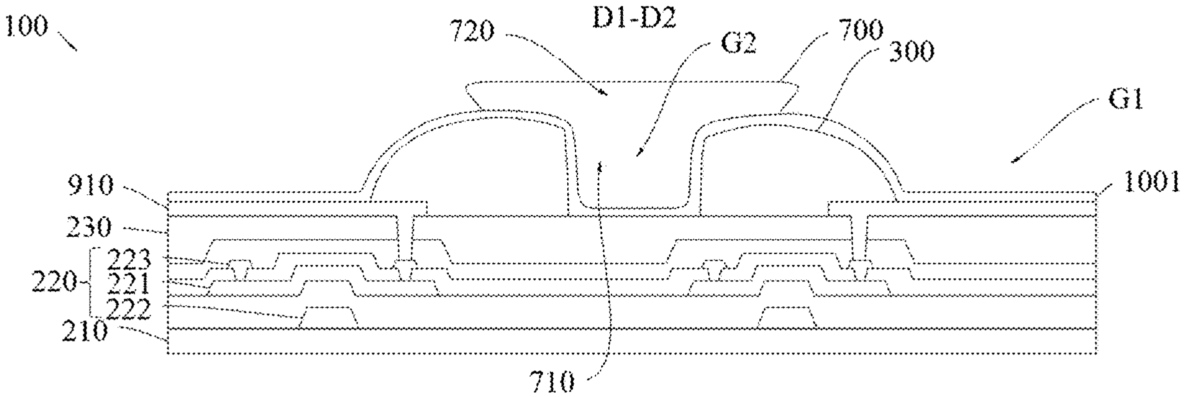
Figure 20F:
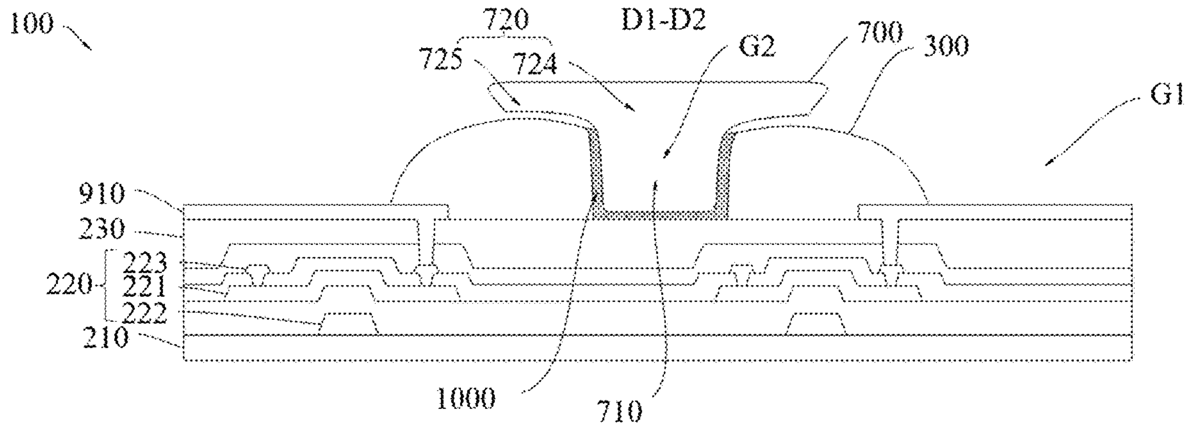

Referring to FIG. 7, FIG. 20E, and FIG. 20F, during the manufacturing process, a first material layer 1001 may be disposed on the sidewalls of the second grooves G2 and the surface of the pixel definition layer 300, then a material film layer of the partitions 700 is formed, then the material film layer of the partitions 700 is patterned, and then the first material layer 1001 is patterned, so as to remove part of the first material layer 1001 between the second portions 720 and the pixel definition layer 300, so that the first layer 1000 is formed while the second portions 720 are suspended, which increases the probability of the disconnection of the common layer 600 at the side of the second sub-portion 725 when the common layer 600 is subsequently formed, and there is a greater probability of reducing the leakage paths of the leakage current, which reduces the risk of mis-lighting of pixels.

In some embodiments, referring to FIG. 7, the first layer 1000 is further disposed between a bottom surface of the first portion 710 and a bottom surface of the second groove G2.

Through the processes illustrated in FIG. 20A to FIG. 20F, the first layer 1000 is provided between the bottom surface of the first portion 710 and the bottom surface of the second groove G2, which may properly raise the partition 700, increase a distance between the second portion 720 and the pixel definition layer 300, increases the probability that the light emitting layer 400, such as the common layer 600, is disconnected at the side of the second sub-portion 725, and has a greater probability of reducing the leakage paths of the leakage current, thereby reducing the risk of mis-lighting of pixels.

In some embodiments, referring to FIG. 7, the first layer 1000 also extends between the surface of the pixel definition layer 300 away from the substrate 210 and the second portion 720, and the end of the light emitting layer 400 on the side of the partition 700 is spaced apart from the first layer 1000.

During the manufacturing process, the first layer may extend from the second groove to the bottom of the second portion by adjusting the etching process conditions, which is beneficial to have a better supporting effect on the second portion and reduce a risk of the second portion being stuck.

In some embodiments, the first material layer, that is, the material of the first layer 1000, includes a metal oxide material or an inorganic material. The metal oxide material may include a combination of any one or more of ITO, IZO, etc., and the inorganic material such as an insulating material may include a combination of any one or more of silicon oxide compound, silicon nitride compound, silicon oxynitride, etc. The first layer 1000 is mainly used to suspend the second portion 720 after patterning, which is only used as an example here and not specifically limited.

Figure 8:
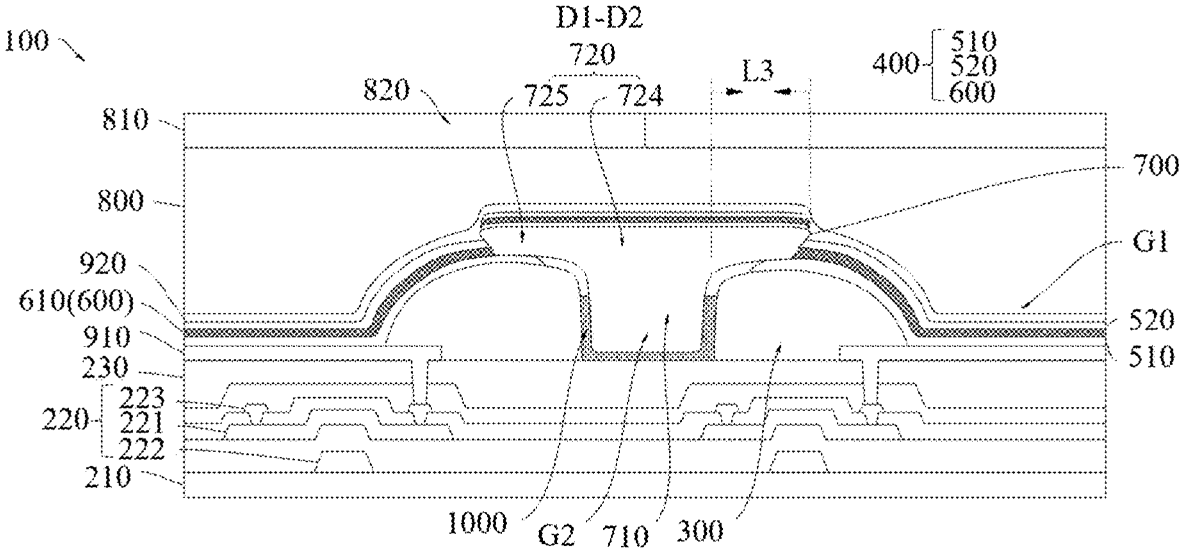
FIG. 8 is a schematic view of a fourth sectional structure along D1-D2 in FIG. 1.

In some embodiments, referring to FIG. 7 and FIG. 8, the light emitting layer 400 and the first layer 1000 are arranged at intervals. The material of the first layer 1000 may include a metal oxide material, such as a combination of any one or more of ITO, IZO, etc. At this time, the first layer 1000 may have conductivity. The light emitting layer 400 (such as the first light emitting sublayer 510) is spaced apart from the first layer 1000 to avoid new leakage paths and reduce the risk of mis-lighting of pixels.

In some embodiments, referring to FIG. 8, a distance between an end surface of the first layer 1000 away from the substrate 210 and the substrate 210 is less than a distance between the surface of the pixel definition layer 300 away from the substrate 210 and the substrate 210.

When patterning the first material layer 1001 to form the first layer 1000, part of the first material layer 1001 located on the sidewalls of the second grooves G2 may be etched away by controlling the patterning time, such as etching time, etc., so as to reduce the risk of contact between the common layer 600 and the first layer 1000. The material of the first layer 1000 may include a metal oxide material, such as a combination of any one or more of ITO, IZO, etc. The common layer 600 is spaced apart from the first layer 1000 to prevent new leakage paths from being generated and reduce the risk of mis-lighting of pixels.

Figure 14:
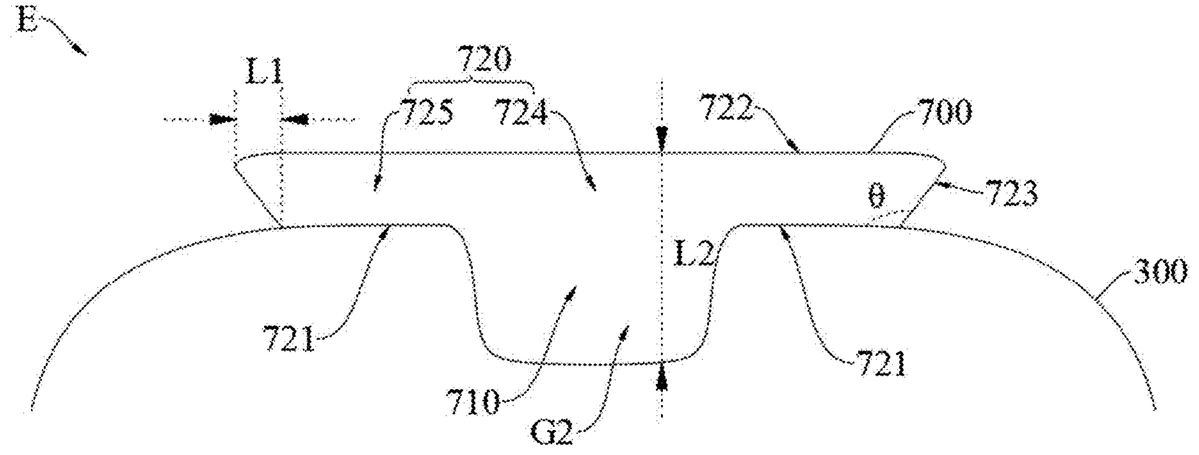
FIG. 14 is an enlarged schematic view of area E in FIG. 13.
Figure 16:
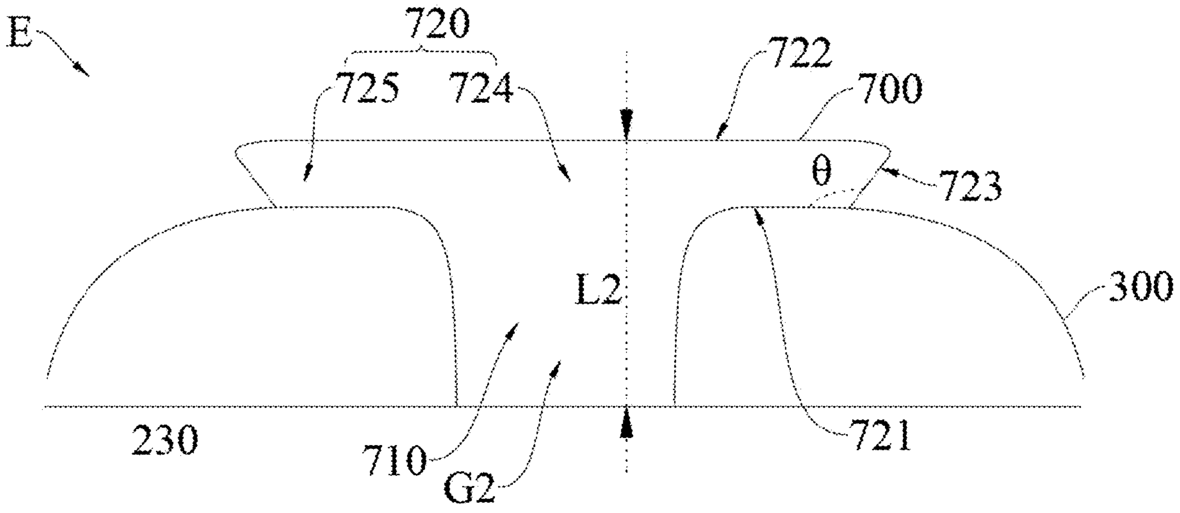
FIG. 16 is an enlarged schematic view of area E in FIG. 15.

In some embodiments, referring to FIG. 5, FIG. 14, and FIG. 16, a distance (a second distance L2) between the second surface 722 and a surface of the first portion 710 adjacent to the substrate 210 ranges from 0.1 μm to 4 μm.

A distance between the first surface 721 and a surface of the pixel definition layer 300 adjacent to the second portion 720 may be less than the second distance L2. The distance may be adjusted according to actual conditions, such as manufacturing precision, process requirements, etc., and are only used as examples here, without specific limitation.

In some embodiments, referring to FIG. 5, in a top view direction, a distance (a third distance L3) between an end point of the second sub-portion 725 farthest away from the first sub-portion 724 and the first portion 710 is greater than or equal to 0.2 μm, so as to reduce the probability of contact between the first layer 1000 and at least part of the sub-film layers (such as the common layer 600) of the light emitting layer when the first layer 1000 is a metal oxide, which prevents new leakage paths from being generated and reduces the risk of mis-lighting of pixels.

In some embodiments, referring to FIG. 5, the second portion 720 includes a first surface 721 close to the first portion 710 and a second surface 722 away from the first portion 710. An orthographic projection of the first surface 721 on the substrate 210 is located within an orthographic projection of the second surface 722 on the substrate 210.

An area of an upper surface of the second portion 720 is greater than or equal to an area of a lower surface of the second portion 720, and the second portion 720 forms a non-regular trapezoidal structure, thereby facilitating that at least part of the sub-film layers (such as the common layer 600) of the light emitting layer is disconnected at the side of the second portion 720, and reducing the leakage paths of the leakage current, which is beneficial to reducing the risk of mis-lighting of pixels, and especially improving the visual effect of the display panel at low gray levels. For the convenience of description, the side of the second portion 720 is represented by a first side 723, which will not be described in detail below.

On a condition that the partitions are directly arranged on the pixel definition layer, a portion of the partition protruding from the pixel definition layer is too high and will contact a mask to be scratched during the evaporation process, thereby generating particles, which is easy to make the encapsulation layer invalid. In addition, thicker organic materials are required for leveling during encapsulation, which will increase the risk of module manufacturing process and lead to a decrease in yield. If the height of the partition is directly removed, a fine mask and an increase in related processes will be required, which will increase the costs. Therefore, referring to FIG. 4, the first portion 710 of the partition 700 is arranged in the second groove G2, so as to reduce an overall height of the partition 700, reduce a thickness of the second portion 720, improve the leveling of the organic film layers in the encapsulation layer 800, reduce the number of bubbles generated when the organic film layers are solidified, and improve the packaging performance of the encapsulation layer 800, so that it may also ensure better package reliability while effectively improving the poor display caused by mis-lighting of pixels.

In some embodiments, referring to FIG. 5, an outer contour of the orthographic projection of the first surface 721 on the substrate 210 is spaced apart from an outer contour of the orthographic projection of the second surface 722 on the substrate 210.

The second portion 720 of the partition 700 has an inverted trapezoidal structure with a wide top and a narrow bottom, which is more conducive to the disconnection of at least part of the sub-film layers of the light emitting layer 400 at the side of the second portion 720, thereby reducing the leakage paths of the leakage current and reducing the risk of mis-lighting of pixels.

In some embodiments, referring to FIG. 5, an included angle θ between the side of the second portion 720 and the first surface 721 ranges from 100° to 120°.

The side of the second portion 720 forms an undercut structure with the pixel definition layer 300, thereby increasing the probability of the disconnection of at least part of the sub-film layers of the light emitting layer 400 at the side of the second portion 720. If an included angle between the side of the second portion 720 and the substrate 210 is too small, the probability of the disconnection of at least part of the sub-film layers of the light emitting layer 400 at the side of the second portion 720 will decrease. If the included angle between the side of the second portion 720 and the substrate 210 is too large, the process difficulty and costs of forming the partitions 700 will increase. The included angle θ between the side of the second portion 720 and the first surface 721 ranges from 100° to 120°, which may not only improve the probability of the disconnection of at least part of the sub-film layers of the light emitting layer 400 at the side of the second portion 720, but also facilitate the production and formation.

In some embodiments, referring to FIG. 14, in the top view direction of the display panel 100, corresponding to a same side of the same second portion 720, a distance (first distance L1) between an end point of the second surface 722 farthest away from the first sub-portion 724 and an end point of the first surface 721 farthest away from the first sub-portion 724 ranges from 0.1 μm to 2 μm. It is easy to understand that the definition of L1 may also be applied to any of the embodiments in FIG. 4 to FIG. 12.

The side of the second portion 720 forms an undercut structure with the pixel definition layer 300, thereby increasing the probability of the disconnection of at least part of the sub-film layers of the light emitting layer 400 at the side of the second portion 720. If the distance L1 is too small, the probability of the disconnection of at least part of the sub-film layers of the light emitting layer 400 at the side of the second portion 720 will decrease. If the first distance L1 is too large, the difficulty and costs of forming the partitions 700 will increase. The first distance L1 ranges from 0.1 μm to 2 μm, which may not only improve the probability of the disconnection of at least part of the sub-film layers of the light emitting layer 400 at the side of the second portion 720, but also facilitate the production and formation.

In some embodiments, the material of the partitions 700 may be a negative photoresist. Due to the characteristics of the negative photoresist, it is convenient to form the second portion 720 in the inverted trapezoidal structure with a wide top and a narrow bottom.

In some embodiments, referring to FIG. 4, the light emitting layer 400 is spaced apart from the side of the second portion 720. It is easy to understand that the limitation that the light emitting layer 400 is spaced apart from the side of the second portion 720 may also be applied to any of the embodiments in FIG. 4 to FIG. 12.

Any film layer of the light emitting layer 400 is disconnected at the side of the second portion 720 to minimize the leakage paths of the leakage current and reduce the risk of mis-lighting of pixels.

In some embodiments, the first light emitting sublayer 510 includes a first luminescent material layer 511 and a hole injection transport layer (HITL) 620 located on a side of the first luminescent material layer 511 close to the substrate 210. The first luminescent material layer 511 is disconnected at the partitions 700, and the hole injection transport layer 620 is disconnected at the partitions 700.

The hole injection transport layer 620 and the first luminescent material layer 511 are paths for generating the leakage current. The two paths are disconnected to reduce the leakage paths of the leakage current and reduce the risk of mis-lighting of pixels. Specifically, the common layer 600 may further include the hole injection transport layer 620.

It is easy to understand that the embodiments in which the first light emitting material layer 511 and the hole injection transport layer 620 are arranged to be spaced apart from the side of the second portion 720 may be applied to single devices, and only examples are given here, without specific restrictions.

In some embodiments, referring to FIG. 4, the light emitting layer 400 includes a first light emitting sublayer 510, a second light emitting sublayer 520 located on a side of the first light emitting sublayer 510 away from the substrate 210, and a charge generation layer 610 between the first light emitting sublayer 510 and the second light emitting sublayer 520. The charge generation layer 610 is disconnected at the partitions 700.

Figure 12:
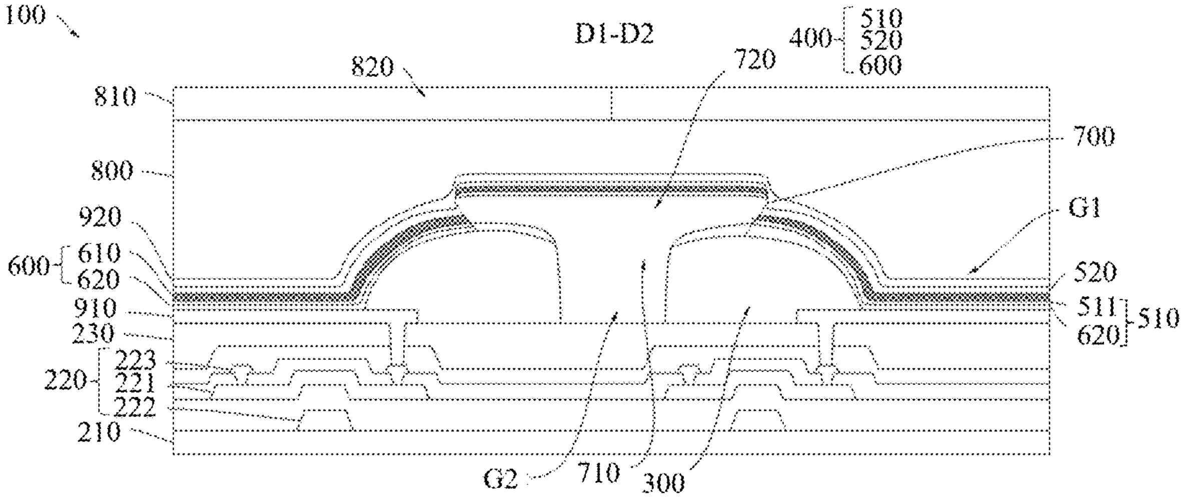
FIG. 12 is a schematic view of an eighth sectional structure along D1-D2 in FIG. 1.
Figure 13:
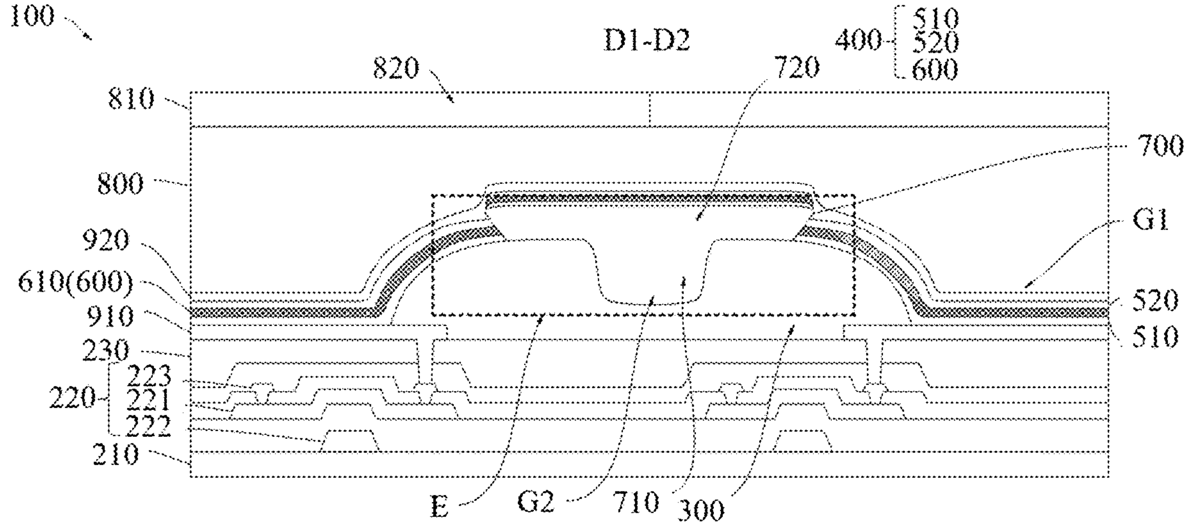
FIG. 13 is a schematic view of a ninth sectional structure along D1-D2 in FIG. 1.

In the light emitting layer of the tandem device, the charge generation layer 610 is provided between the first light emitting sublayer 510 and the second light emitting sublayer 520. Referring to FIG. 12, compared to the hole injection transport layer 620 and the first luminescent material layer 511, the leakage current is more likely to be generated in the charge generation layer 610, so that the adjacent pixels are stealthily lit. The main path of the leakage current of the tandem device is disconnected, so as to reduce the leakage paths of the leakage current and reduce the risk of mis-lighting of pixels.

In some embodiments, referring to FIG. 12, the common layer 600 further includes a hole injection transport layer 620 located on the side of the first luminescent material layer 511 close to the substrate 210. The first luminescent material layer 511 is arranged to be spaced apart from the side of the second portion 720, and the hole injection transport layer 620 is arranged to be spaced apart from the side of the second portion 720.

It is easy to understand that the embodiments in which the first light emitting material layer 511 and the hole injection transport layer 620 are arranged to be spaced apart from the side of the second portion 720 may be applied to tandem devices, and only examples are given here, without specific restrictions. Both the hole injection transport layer 620 and the first luminescent material layer 511 are paths for generating the leakage current, and the two paths are disconnected to reduce the leakage paths of the leakage current and reduce the risk of mis-lighting of pixels.

In some embodiments, in the tandem devices, only the charge generation layer 610 may be arranged to be spaced apart from the side of the second portion 720; or in the tandem devices, the charge generation layer 610 and the first light emitting material layer may be arranged to be spaced apart from the side of the second portion 720; or in the tandem devices, the charge generation layer 610, the first light emitting material layer, and the hole injection transport layer 620 may be arranged to be spaced apart from the side of the second portion 720. Only examples are given here, without specific restrictions.

In some embodiments, referring to FIG. 4, the display panel 100 further includes an anode layer 910 and a cathode layer 920. The anode layer 910 is disposed on the substrate 210, and the pixel definition layer 300 exposes part of the anode layer 910. The cathode layer 920 is disposed on the side of the light emitting layer 400 away from the substrate 210.

In some embodiments, referring to FIG. 4, the cathode layer 920 is continuously disposed on the partitions 700. By adjusting parameters such as a height of the partition 700, a distance between the second portion 720 and the pixel definition layer 300, and a slope of the side of the second portion 720, the cathode layer 920 is continuously arranged on the partitions 700, so as to prevent a broken arrangement of the cathode layer from affecting the electrical performance, and reduce the risk that cathode signals cannot be transmitted to the light emitting areas A.

Figure 15:
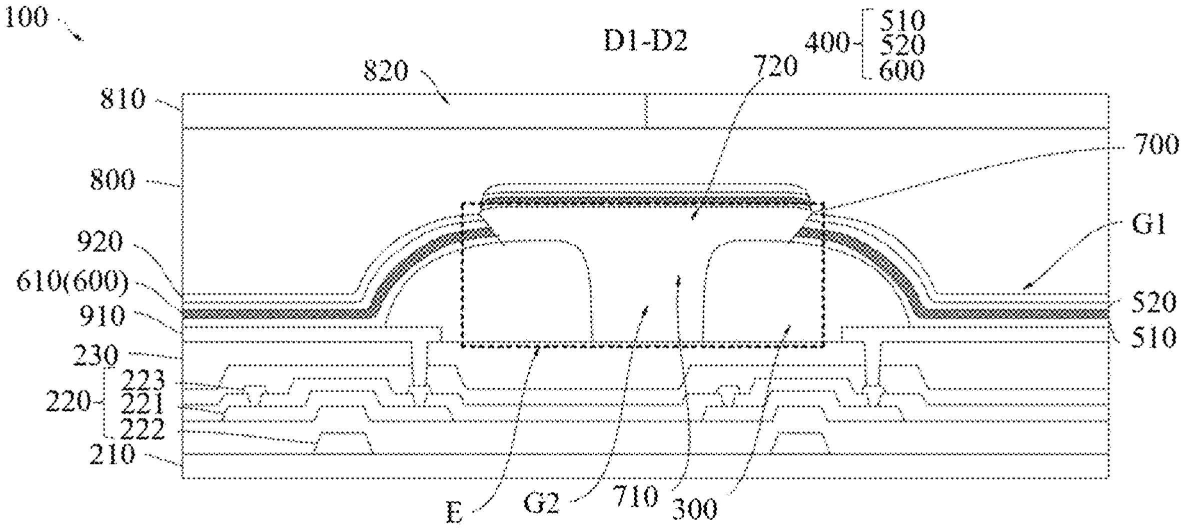
FIG. 15 is a schematic view of a tenth sectional structure along D1-D2 in FIG. 1.

In some embodiments, referring to FIG. 15, the cathode layer 920 is arranged to be spaced apart from the side of the second portion 720. By adjusting parameters such as the height of the partition 700, the distance between the second portion 720 and the pixel definition layer 300, and the slope of the side of the second portion 720, the cathode layer 920 may be disconnected at the side of the second portion 720. If the cathode layer 920 is required to be connected to the side of the second portion 720, the process parameters and the thickness of the second portion 720 need to be controlled, which will increase the process costs. Therefore, the requirement on the thickness of the second portion 720 may be appropriately relaxed to reduce the costs, and the cathode layer 920 is disconnected at the side of the second portion 720. It is easy to understand that the limitation that the cathode layer 920 is arranged to be spaced apart from the side of the second portion 720 may also be applied to any of the embodiments in FIG. 4 to FIG. 12.

In some embodiments, the display panel 100 further includes the cathode layer 920 disposed on the side of the light emitting layer 400 away from the substrate 210. The common layer 600 may further include an electron transport layer located between the cathode layer 920 and the second light emitting sublayer 520.

In some embodiments, the electron transport layer may be arranged to be spaced apart from the side of the second portion 720.

In some embodiments, the electron transport layer may be continuously disposed on the side of the second portion 720. Only examples are given here, without specific restrictions to the electron transport layer.

In some embodiments, referring to FIG. 1, the display panel 100 includes a plurality of pixels arranged corresponding to the light emitting areas A. The cathode layer 920 is arranged to be spaced apart from the side of the second portion 720. The second grooves G2 are correspondingly arranged around each of the pixels in a non-closed loop.

When the cathode layer 920 is disconnected at the side of the second portion 720, the corresponding second grooves G2 cannot be arranged in a closed loop around the pixel, so as to prevent the cathode layer 920 in the light emitting area A from becoming an island, and avoid a technical problem that the cathode signal is unable to be transmitted to the light emitting area A.

In some embodiments, referring to FIG. 4, FIG. 5, and FIG. 6, the display panel 100 further includes a driving circuit layer 220 disposed on a side of the substrate 210 and a planarization layer 230 disposed on the driving circuit layer 220. The planarization layer 230 is located on a surface of the driving circuit layer 220 away from the substrate 210, and the second groove G2 penetrates the pixel definition layer 300 to expose the planarization layer 230, so that the first portion 710 may contact with the planarization layer 230.

The deeper the second groove G2 is, the larger the volume of the second groove G2 is, and the larger the volume of the first portion 710 filled in the second groove G2 is, thereby reducing the thickness of the second portion 720, reducing the overall height of the partition 700, improving the leveling of the organic film layers in the encapsulation layer 800, and improving the packaging reliability of the encapsulation layer 800. At the same time, the deeper the second groove G2 is, the larger the contact area between the pixel definition layer 300 and the first portion 710 is, which improves the adhesion between pixel definition layer 300 and partition 700, reduces the risk of the partition 700 peeling off, improves the leveling of the organic film layers in encapsulation layer 800, and improves the package reliability of the encapsulation layer 800.

In some embodiments, referring to FIG. 4, the driving circuit layer 220 may include an active layer 221, a gate layer 222, a source-drain layer 223, and insulation layers each between adjacent film layers.

Specifically, referring to FIG. 4, the structure of the driving circuit layer 220 may be designed as a top gate or a bottom gate. Only examples are given here, without specific restrictions.

In some embodiments, the second groove G2 penetrates through the pixel definition layer 300 and makes a portion of the planarization layer 230 form a first recess. The first recess is filled with the first portion 710. A contact area between the first portion 710 and the planarization layer 230 is further increased to improve the adhesion between the substrate 210 and the partitions 700, thereby reducing the risk of the partition 700 peeling off, improving the leveling of the organic film layers in the encapsulation layer 800, and improving package reliability of the encapsulation layer 800.

Figure 9:
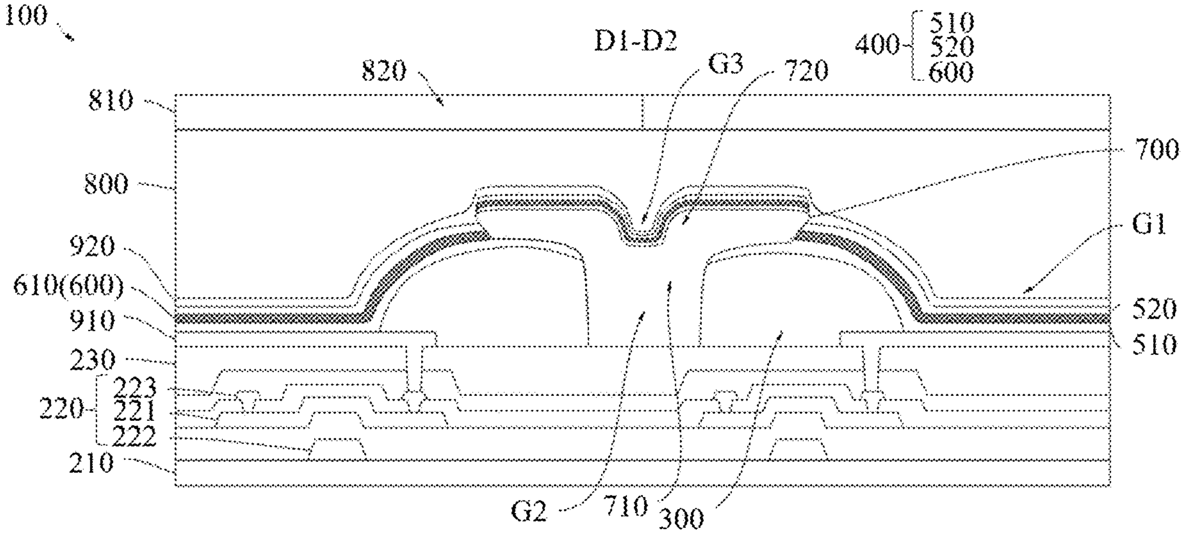
FIG. 9 is a schematic view of a fifth sectional structure along D1-D2 in FIG. 1.

In some embodiments, referring to FIG. 9, each partition 700 further includes a third groove G3 disposed on a side of the second portion 720 away from the substrate 210. The third groove G3 is provided with at least part of the sub-film layers of the light emitting layer 400 therein.

The third groove G3 is defined by digging a groove on the second portion 720 of the partition 700, which may increase the probability of the disconnection of at least part of the sub-film layers of the light emitting layer 400 in the third groove G3, thereby reducing the risk of forming the leakage paths of the leakage current and reducing the risk of mis-lighting of pixels.

Figure 10:
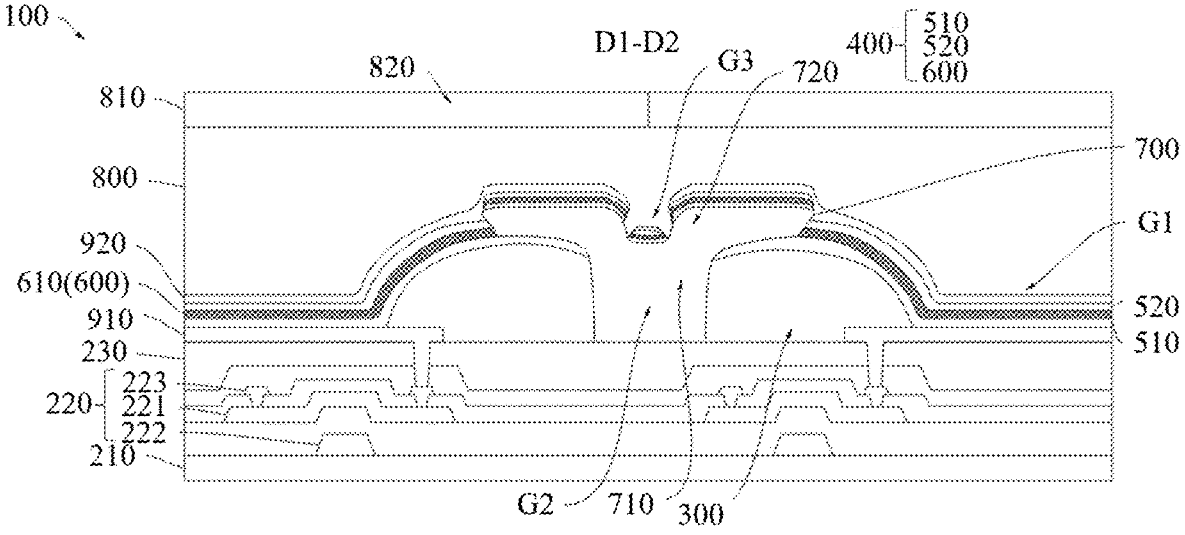
FIG. 10 is a schematic view of a sixth sectional structure along D1-D2 in FIG. 1.

In some embodiments, referring to FIG. 10, at least part of the sub-film layers of the light emitting layer 400 are disposed intermittently in the third groove G3.

At least part of the sub-film layers of the light emitting layer 400 are broken in the third groove G3, preferably the charge generation layer 610, less preferably the first light emitting material layer 511 or/and the hole injection transport layer 620, thereby reducing the leakage paths of the leakage current and reducing the risk of mis-lighting of pixels.

Figure 11:
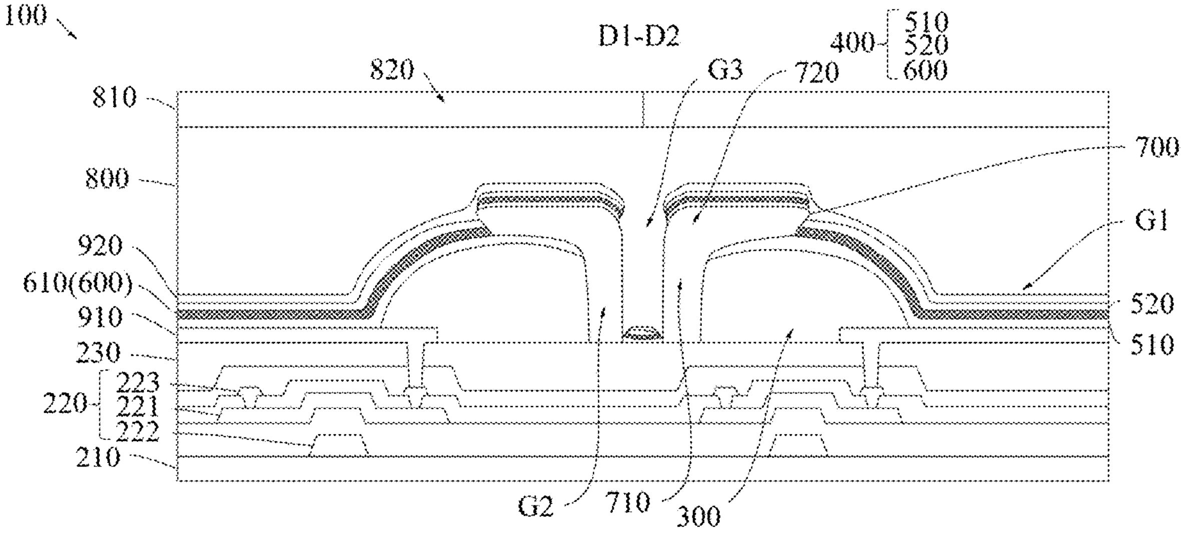
FIG. 11 is a schematic view of a seventh sectional structure along D1-D2 in FIG. 1.

In some embodiments, referring to FIG. 11, the third groove G3 runs through the second portion 720 and the first portion 710.

The deeper the third groove G3 is, the greater the probability that at least part of the sub-film layers of the light emitting layer 400 are broken in the third groove G3, so there is a greater probability of reducing the leakage paths of the leakage current and reducing the risk of mis-lighting of pixels.

In some embodiments, referring to FIG. 11, the third groove G3 runs through the second portion 720, the first portion 710, and the pixel definition layer 300. At least part of the sub-film layers of the light emitting layer 400 are arranged in contact with the planarization layer 230 through the third groove G3.

In some embodiments, referring to FIG. 11, the display panel 100 further includes a driving circuit layer 220 disposed on a side of the substrate 210 and a planarization layer 230 disposed on the driving circuit layer 220. The planarization layer 230 is located on a surface of the driving circuit layer 220 away from the substrate 210. The third groove G3 penetrates through the second portion 720, the first portion 710, and the pixel definition layer 300 to expose the planarization layer 230, so that at least part of the sub-film layers of the light emitting layer 400 may be in contact with the planarization layer 230.

In some embodiments, the third groove G3 runs through the second portion 720, the first portion 710, and the pixel definition layer 300 and makes a portion of the planarization layer 230 form a second recess. The second recess is filled with the common layer 600. A depth of the third groove G3 is increased, so that at least part of the sub-film layers of the light emitting layer 400 are more likely to break in the third groove G3, and the leakage paths of the leakage current are more likely to be reduced, thereby reducing the risk of mis-lighting of pixels.

In some embodiments, referring to FIG. 9 and FIG. 11, the display panel 100 further includes an anode layer 910 and a cathode layer 920. The anode layer 910 is disposed on the substrate 210. The pixel definition layer 300 expose a part of the anode layer 910. The cathode layer 920 is disposed on the side of the light emitting layer 400 away from the substrate 210. The third groove G3 is provided with the cathode layer 920 therein.

The cathode layer 920 is also disposed in the third groove G3, which may fill the third groove G3, prevent the groove from being too deep, reduce the difficulty of covering of the encapsulation layer 800, and reduce the risk of packaging failure.

In some embodiments, referring to FIG. 1 to FIG. 3, there is at least one second groove G2 provided between two adjacent light emitting areas A, and there is at least some second grooves G2 each extending along a periphery of an adjacent light emitting area A.

For example, referring to FIG. 1, one second groove G2 is arranged between the second-color light emitting area A2 and the third-color light emitting area A3, and two second grooves G2 are arranged between the second-color light emitting area A2 and the first-color light emitting area A1. It is easy to understand that a number of the second grooves between two adjacent light emitting areas A may be three or even more, and the number of the second grooves between two adjacent light emitting areas A may be adjusted according to the actual situation such as space occupation, so there is no specific limit here.

For example, on a condition that the second-color light emitting area A2 is elliptical, the second groove G2 between the second-color light emitting area A2 and the first-color light emitting area A1 is arranged as a curved groove extending along an edge of the adjacent second-color light emitting area A2, so that the second groove G2 between the second-color light emitting area A2 and the first-color light emitting area A1 may extend further in the direction towards the second groove G2 between the second-color light emitting area A2 and the third-color light emitting area A3, thereby reducing the distance between the aforementioned two second grooves G2 and further narrowing a communication channel of the common layer 600 here, so that a magnitude of the lateral leakage here is kept below a target value.

Here is only an exemplary description based on the specific pixel arrangement. In practical applications, according to the specific pixel arrangement structure, the second groove G2 may be not only the above-mentioned curved groove, but also wave-shaped groove, broken-line groove, etc. The shapes of each pixel and each color light emitting area are only illustrative, and in actual application, adjustments are made according to specific conditions.

In some embodiments, referring to FIG. 2, the display panel 100 includes a plurality of pixels arranged corresponding to the light emitting areas A. At least one of the pixels is surrounded by the second grooves G2 arranged in a closed loop.

The second grooves G2 arranged around the pixel in the closed loop may increase the probability of the common layer breaking on the side of the second portion 720, thereby reducing the risk of the leakage paths of the leakage current and reducing the risk of mis-lighting of pixels.

On a condition that the cathode layer 920 is disconnected at the side of the second portion 720, the corresponding second grooves G2 cannot be arranged in a closed loop around the pixel, so as to prevent the cathode layer 920 in the light emitting area A from becoming an island, and avoid the technical problem that the cathode signal is unable to be transmitted to the light emitting area A.

In some embodiments, referring to FIG. 4, the display panel 100 further includes a color filter layer 810 located on a side of the encapsulation layer 800 away from the substrate 210. The color filter layer 810 includes a plurality of color resists 820. A color of the color resist 820 corresponds to a color of the pixel.

In the present disclosure, partitions are provided in the non-light emitting area, the first portion of the partition is arranged in the second groove, the second portion of the partition is wider than the first portion, and the second portion of the partition is spaced apart from the pixel definition layer. It is beneficial for disconnection of at least part of the sub-film layers of the light emitting layer at the side of the second portion, thereby reducing the leakage paths of the leakage current and reducing the risk of mis-lighting of pixels. At the same time, the second grooves are arranged in the non-light emitting area, and the first portion of the partition is arranged in the second groove, which reduces an overall height of the partition, improves the leveling of organic film layers in the encapsulation layer, and improves the packaging performance, so that it may also ensure better package reliability while effectively improving the poor display caused by mis-lighting of pixels.

Figure 17:
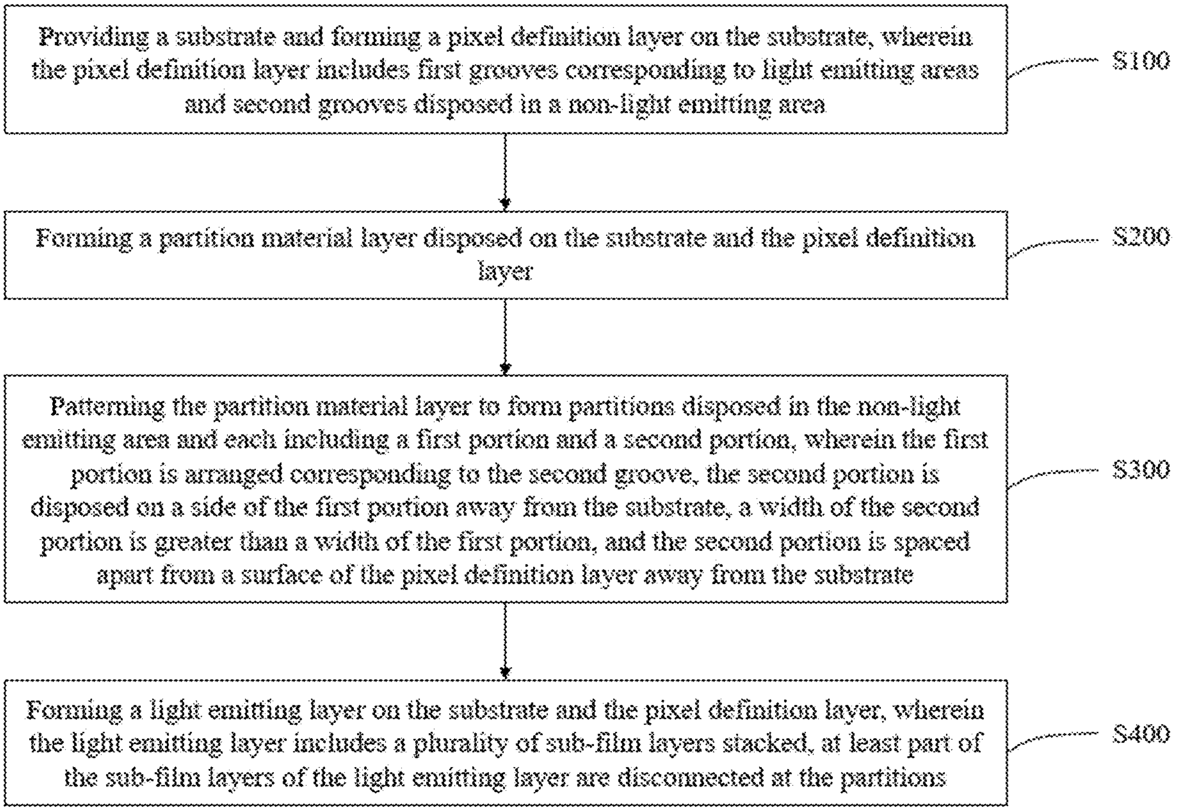
FIG. 17 is a flow chart of steps of a manufacturing method of a display panel provided according to an embodiment of the present disclosure.
Figure 18:
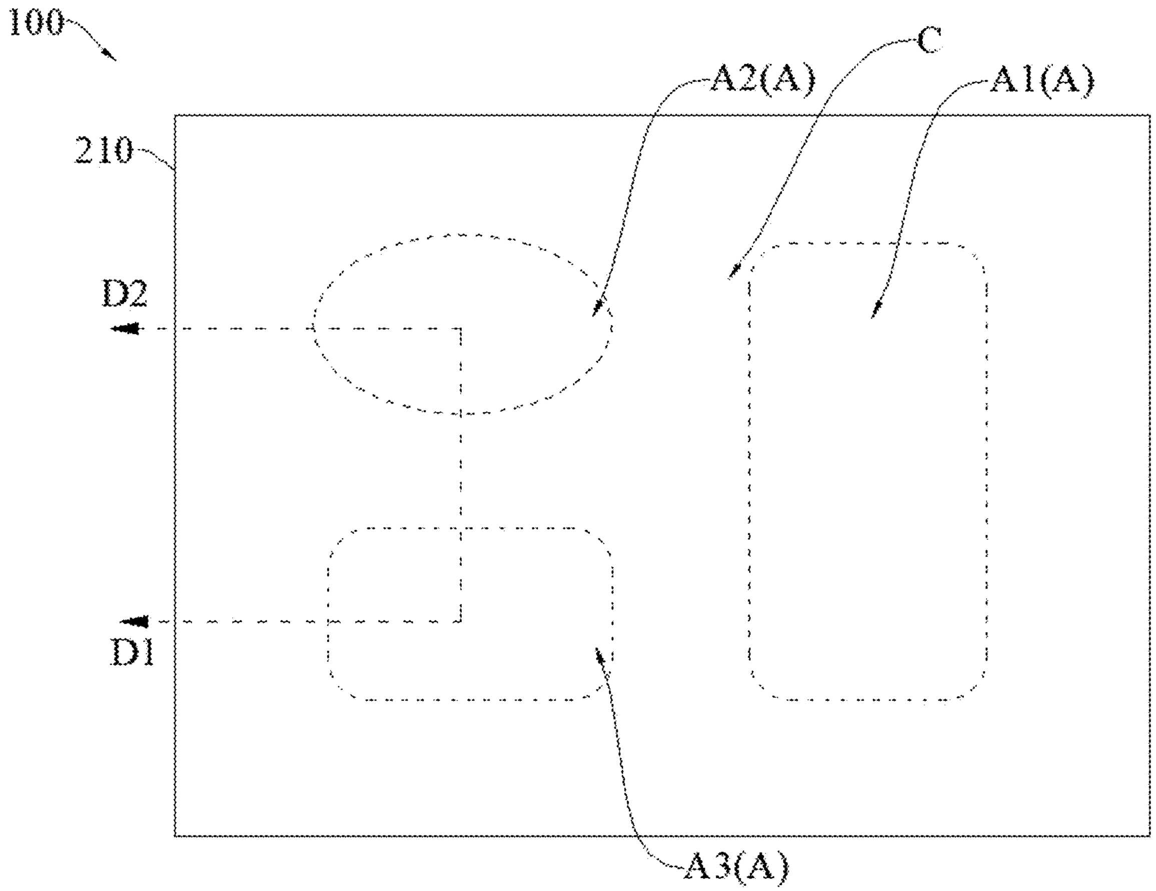
FIG. 18 is a schematic top view of a structure in steps of a manufacturing method of a display panel provided according to an embodiment of the present disclosure.

Referring to FIG. 17, embodiments of the present disclosure provide manufacturing methods of a display panel 100. Referring to FIG. 18, the display panel 100 includes a plurality of light emitting areas A arranged at intervals and a non-light emitting area C disposed between the light emitting areas A. The manufacturing method of the display panel 100 includes:

- S100, providing a substrate 210 and forming a pixel definition layer 300 on the substrate 210, wherein the pixel definition layer 300 includes first grooves G1 corresponding to the light emitting areas A and second grooves G2 disposed in the non-light emitting area C;
- S200, forming a partition material layer 701 disposed on the substrate 210 and the pixel definition layer 300;
- S300, patterning the partition material layer 701 to form partitions 700 disposed in the non-light emitting area C and each including a first portion 710 and a second portion 720, wherein the first portion 710 is arranged corresponding to the second groove G2, the second portion 720 is disposed on a side of the first portion 710 away from the substrate 210, a width of the second portion 720 is greater than a width of the first portion 710, and the second portion 720 is spaced apart from a surface of the pixel definition layer 300 away from the substrate 210; and
- S400, forming a light emitting layer 400 on the substrate 210 and the pixel definition layer 300, wherein the light emitting layer 400 includes a plurality of sub-film layers stacked, at least part of the sub-film layers of the light emitting layer 400 are disconnected at the partitions 700.

In the present disclosure, partitions are provided in the non-light emitting area, the first portion of the partition is arranged in the second groove, the second portion of the partition is wider than the first portion, and the second portion of the partition is spaced apart from the pixel definition layer. It is beneficial for disconnection of at least part of the sub-film layers of the light emitting layer at the side of the second portion, thereby reducing the leakage paths of the leakage current and reducing the risk of mis-lighting of pixels. At the same time, the second grooves are arranged in the non-light emitting area, and the first portion of the partition is arranged in the second groove, which reduces an overall height of the partition, improves the leveling of organic film layers in the encapsulation layer, and improves the packaging performance, so that it may also ensure better package reliability while effectively improving the poor display caused by mis-lighting of pixels.

The technical solutions of the present disclosure will now be described in conjunction with specific embodiments.

In the embodiments, the manufacturing method of the display panel 100 includes following steps S100, S200, S300, and S400.

Figure 19A:
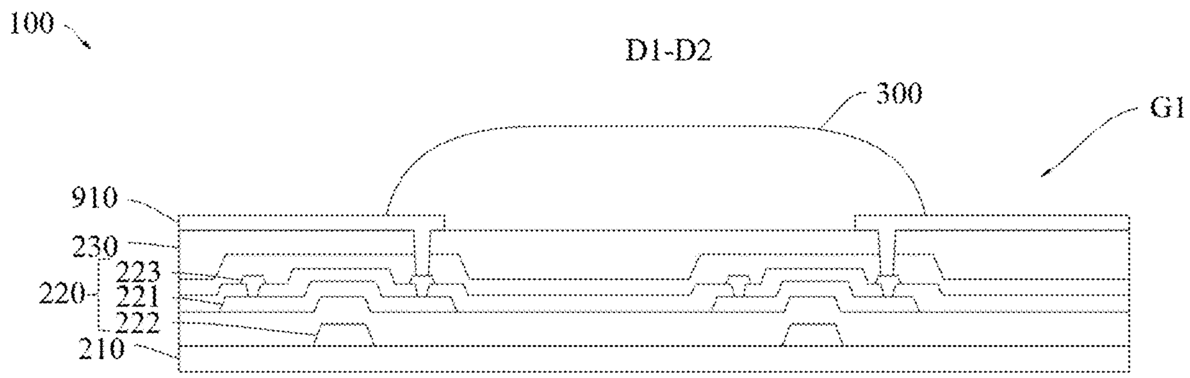
FIG. 19A to FIG. 19F are schematic views of first structures in steps of a manufacturing method of a display panel provided according to an embodiment of the present disclosure.
Figure 19B:
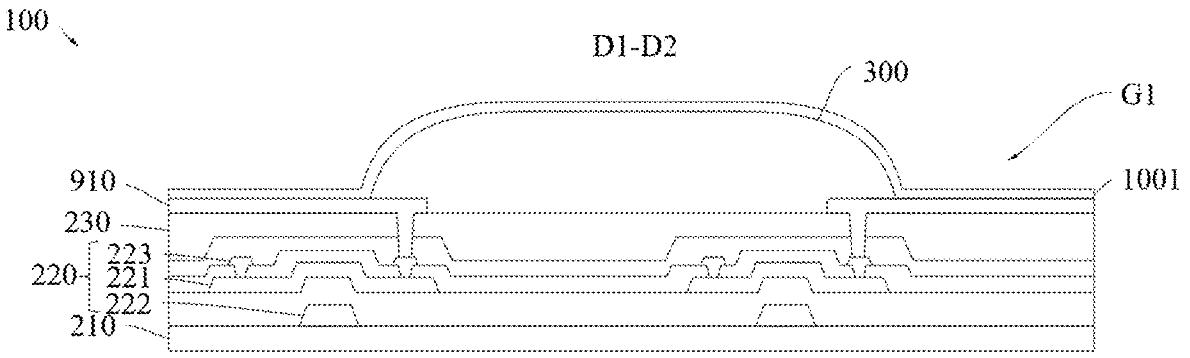
Figure 19C:
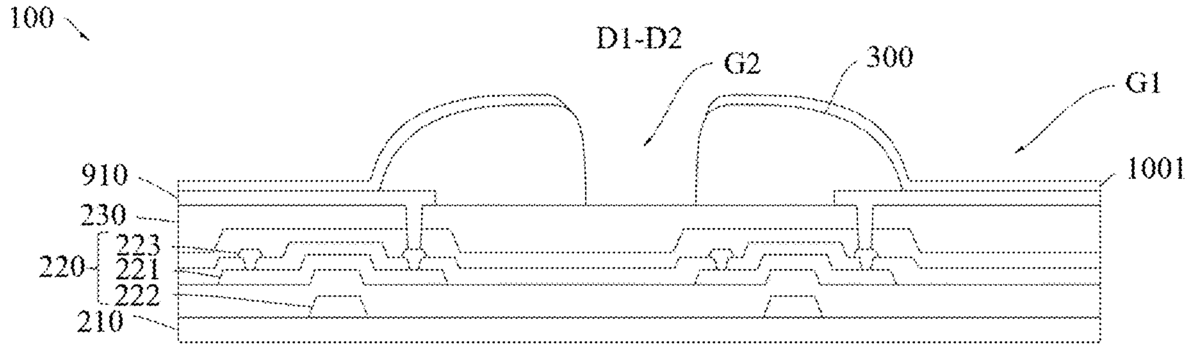

At the step S100, referring to FIG. 19A to FIG. 19C, a substrate 210 is provided and a pixel definition layer 300 is formed on the substrate 210. The pixel definition layer 300 includes first grooves G1 corresponding to the light emitting areas A and second grooves G2 formed in the non-light emitting area C.

In some embodiments, the second portion 720 of the partition 700 formed in a subsequent step includes a first sub-portion 724 and a second sub-portion 725 located on a periphery of the first sub-portion 724. The first sub-portion 724 is connected to the first portion 710. Specifically, the second sub-portion 725 may be arranged in contact with the pixel definition layer 300; or the second sub-portion 725 may be spaced apart from the pixel definition layer 300, so that the second sub-portion 725 is in a suspended state when the light emitting layer 400 is formed. Therefore, according to different manufacturing processes, the step S100 may include:

- S110*a*, referring to FIG. 19A, providing a substrate 210 and forming a pixel definition layer 300 on the substrate 210, the pixel definition layer 300 including first grooves G1 correspondingly formed in the light emitting areas A;
- S120*a*, referring to FIG. 19B, forming a first material layer 1001 on the substrate 210 and the pixel definition layer 300; and
- S130*a*, referring to FIG. 19C, patterning the pixel definition layer 300 to form second grooves G2 in the non-light emitting area C, and removing the first material layer 1001 corresponding to the second groove G2.

In some embodiments, according to different manufacturing processes, the step S100 may include:

- S110*b*, referring to FIG. 20A, providing a substrate 210 and forming a pixel definition layer 300 on the substrate 210, the pixel definition layer 300 including first grooves G1 correspondingly formed in the light emitting areas A;
- S120*b*, referring to FIG. 20B, patterning the pixel definition layer 300 to form second grooves G2 in the non-light emitting area C; and S130*b*, referring to FIG. 20C, forming a first material layer 1001 on the substrate 210 and the pixel definition layer 300.

In some embodiments, a material of the first material layer 1001 includes a metal oxide material or an inorganic material. The metal oxide material includes a combination of any one or more of ITO, IZO, etc., and the inorganic material such as an insulating material includes a combination of any one or more of silicon oxide compound, silicon nitride compound, silicon oxynitride, etc.

In some embodiments, according to different manufacturing processes, the step S100 may include:

S110*c*, providing a substrate 210 and forming a pixel definition layer 300 on the substrate 210, the pixel definition layer 300 including first grooves G1 correspondingly formed in the light emitting areas A, referred in 21A; and S120*c*, patterning the pixel definition layer 300 to form second grooves G2 in the non-light emitting area C, referred in 21B.

Figure 21A:
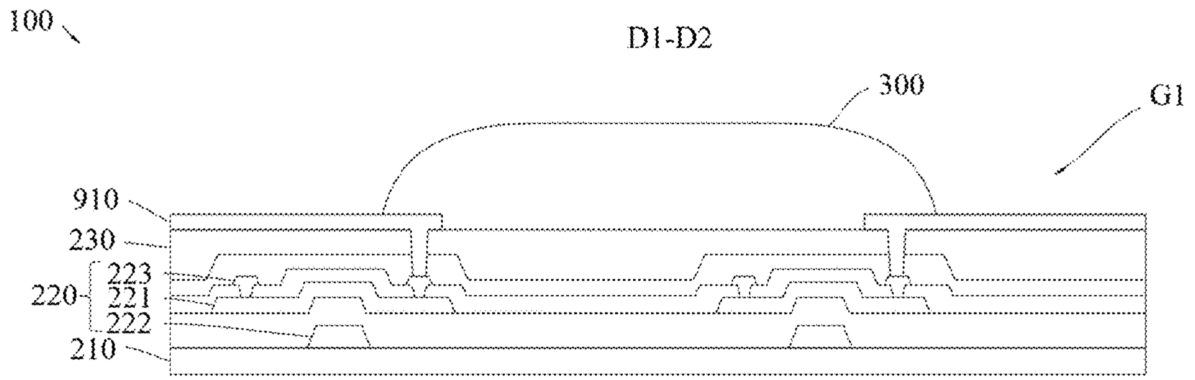
FIG. 21A to FIG. 21D are schematic views of third structures in steps of a manufacturing method of a display panel provided according to an embodiment of the present disclosure.
Figure 21B:
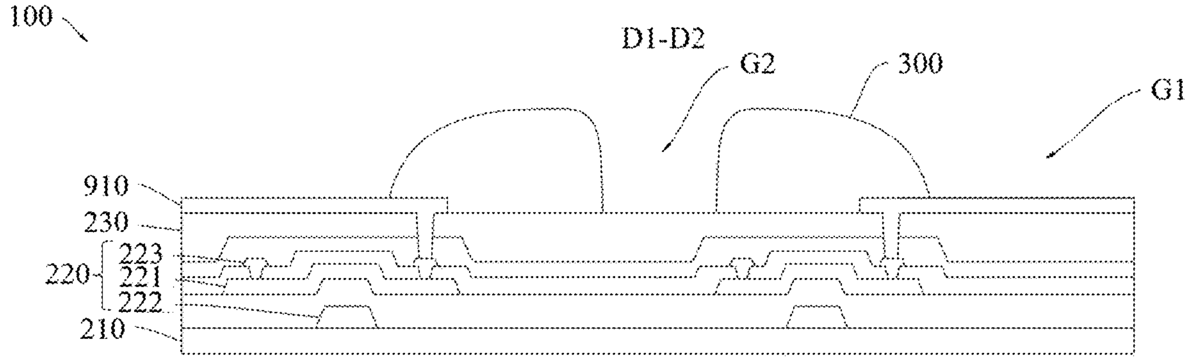

In some embodiments, referring to FIG. 21A, the step of providing the substrate 210 may include providing a substrate 210, forming a driving circuit layer 220 on the substrate 210, forming a planarization layer 230 on the driving circuit layer 220, and forming an anode layer 910 on the planarization layer 230.

In some embodiments, steps S110*c* and S120*c* may be formed in one step.

Figure 19D:
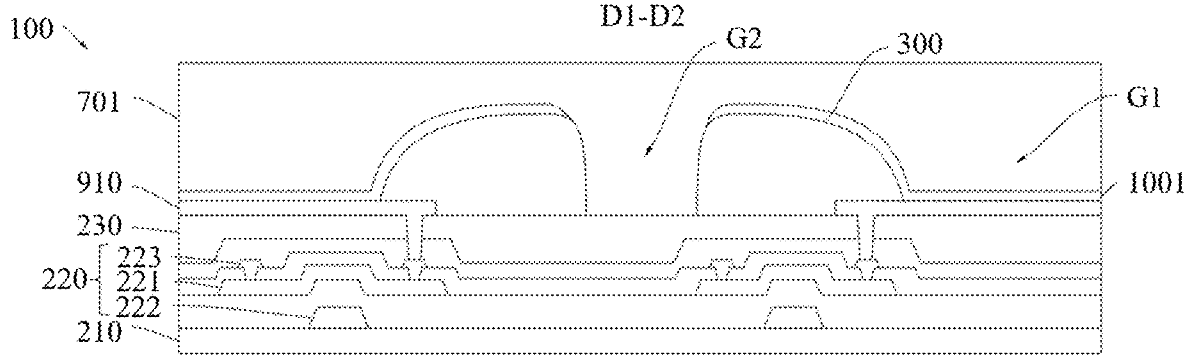
Figure 21C:
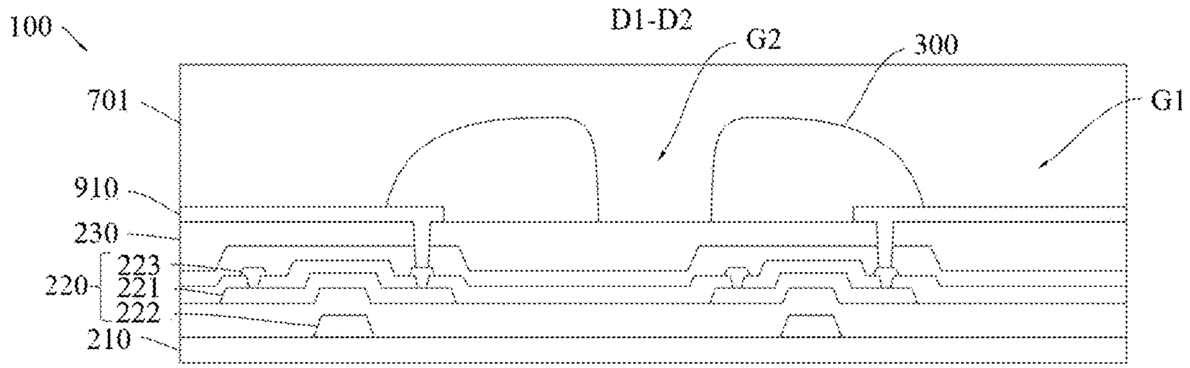
Figure 21D:
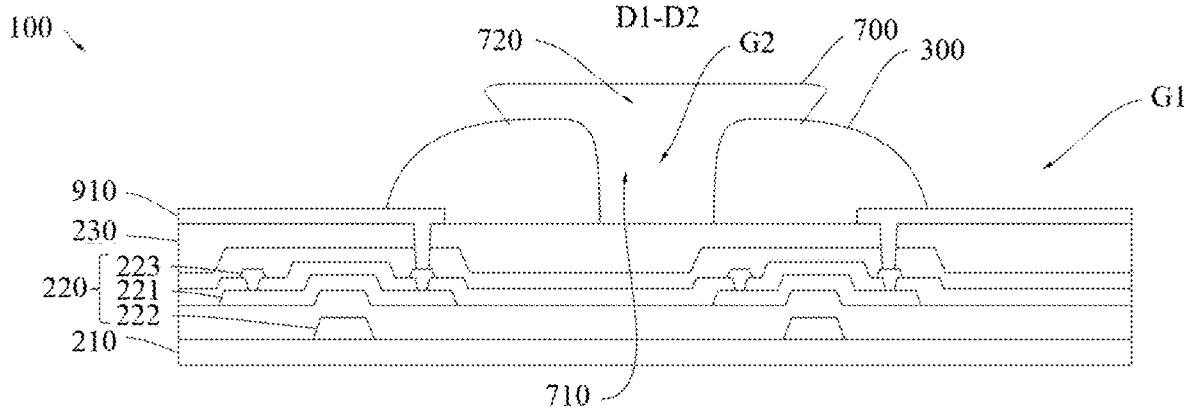

At the step S200, referring to FIG. 19D, FIG. 20D, and FIG. 21C, a partition material layer 701 is formed on the substrate 210 and the pixel definition layer 300.

In some embodiments, a material of the partition material layer 701 may be a negative photoresist, so that the second portion 720 may be formed into an inverted trapezoidal structure with a wide top and a narrow bottom.

Figure 19E:
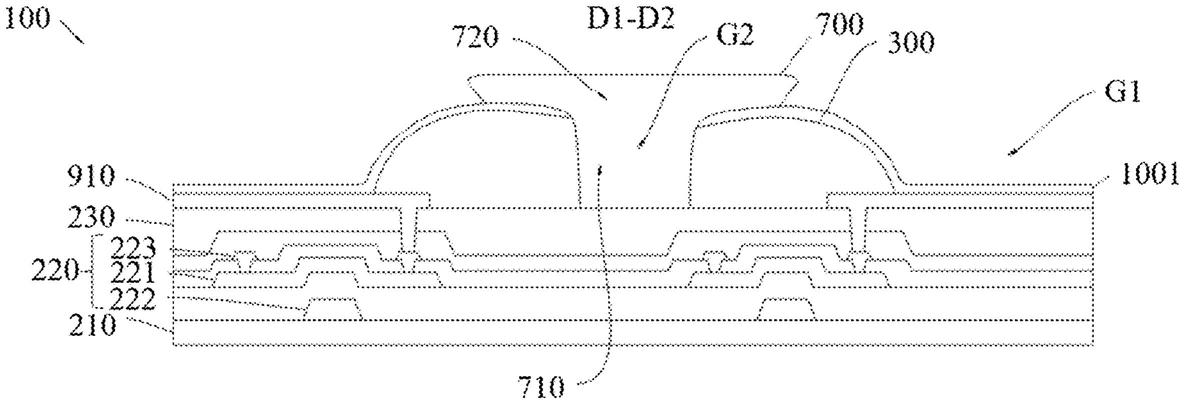

At the step S300, referring to FIG. 19E and FIG. 20E, the partition material layer 701 is patterned to form the partitions 700 disposed in the non-light emitting area C and each including a first portion 710 and a second portion 720; the first portion 710 is arranged corresponding to the second groove G2, and the second portion 720 is disposed on a side of the first portion 710 away from the substrate 210; a width of the second portion 720 is greater than a width of the first portion 710, and the second portion 720 is spaced apart from a surface of the pixel definition layer 300 away from the substrate 210.

In some embodiments, referring to FIG. 4 and FIG. 5, an outer contour of an orthographic projection of the first surface 721 on the substrate 210 is spaced apart from an outer contour of an orthographic projection of the second surface 722 on the substrate 210.

The second portion 720 of the partition 700 has the inverted trapezoidal structure with a wide top and a narrow bottom, which is more conducive to the disconnection of the film layers of the common layer 600 on the side of the second portion 720, thereby reducing the leakage paths of the leakage current and reducing mis-lighting of pixels.

In some embodiments, referring to FIG. 5, an included angle between a side of the second portion 720 and the substrate 210 ranges from 100° to 120°.

The side of the second portion 720 forms an undercut structure with the pixel definition layer 300, thereby increasing the probability that the common layer 600 is disconnected at the side of the second portion 720. If an included angle between the side of the second portion 720 and the substrate 210 is too small, the probability that the light emitting layer 400 is disconnected at the side of the second portion 720 will decrease. If the included angle between the side of the second portion 720 and the substrate 210 is too large, the process difficulty and costs of forming the partitions 700 will increase. The included angle θ between the side of the second portion 720 and the first surface 721 ranges from 100° to 120°, which may not only improve the probability of disconnection of the light emitting layer 400 at the side of the second portion 720, but also facilitate the production and formation.

At the step S400, referring to FIG. 4 and FIG. 5, a light emitting layer 400 is formed on the substrate 210 and the pixel definition layer 300; the light emitting layer 400 includes a plurality of sub-film layers stacked, at least part of the sub-film layers of the light emitting layer 400 are disconnected at the partitions 700.

In some embodiments, referring to FIG. 5, the second portion 720 includes a first sub-portion 724 and a second sub-portion 725 located on the periphery of the first sub-portion 724, and the first sub-portion 724 is arranged to connect the first portion 710.

In some embodiments, according to different manufacturing processes, the step S400 may include steps of S410*a* and S420*a*.

Figure 19F:
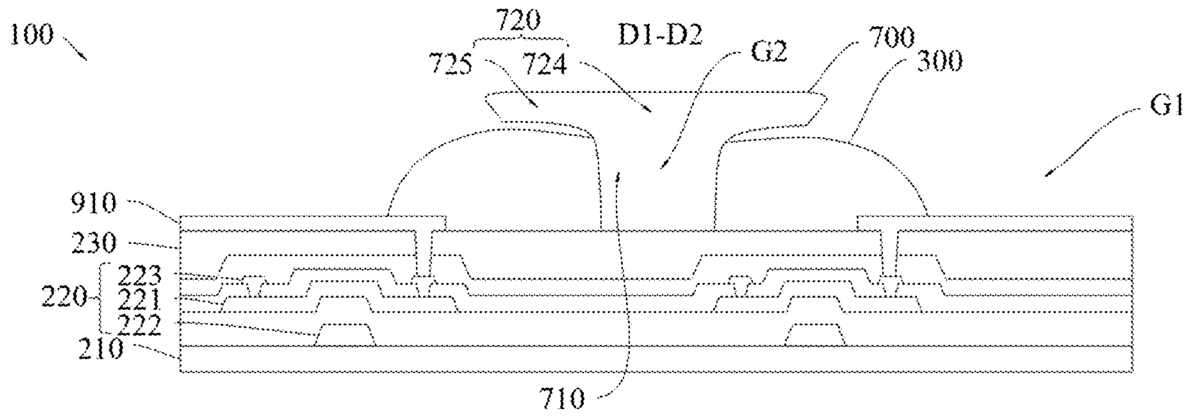

At the step S410*a*, referring to FIG. 19F, the first material layer 1001 is removed to form the second sub-portions 725 spaced apart from the pixel definition layer 300.

In some embodiments, referring to FIG. 19F, the first material layer 1001 is removed, and the second sub-portions 725 are formed to be spaced apart from the pixel definition layer 300, so that the second sub-portions 725 are in a suspended state.

At the step S420*a*, referring to FIG. 4 and FIG. 5, a light emitting layer 400 is formed on the substrate 210 and the pixel definition layer 300. The light emitting layer 400 includes a plurality of sub-film layers stacked. At least part of the sub-film layers of the light emitting layer 400 are disconnected at the partitions 700.

In some embodiments, according to different manufacturing processes, the step S400 may include steps of S410*b* and S420*b*.

At the step S410*b*, referring to FIG. 20F, the first material layer 1001 outside the second grooves G2 is removed to form a first layer 1000 inside the second grooves G2.

In some embodiments, referring to FIG. 20F, the first material layer 1001 outside the second groove G2 is removed, and the second sub-portions 725 are formed to be spaced apart from the pixel definition layer 300, so that the second sub-portions 725 are in a suspended state.

In some embodiments, referring to FIG. 8, a distance between an end surface of the first layer 1000 away from the substrate 210 and the substrate 210 is less than a distance between a surface of the pixel definition layer 300 away from the substrate 210 and the substrate 210.

When patterning the first material layer 1001 to form the first layer 1000, part of the first material layer 1001 located on the sidewalls of the second grooves G2 may be etched away by controlling the patterning time, such as etching time, etc., so as to reduce the risk of contact between the common layer 600 and the first layer 1000. The material of the first layer 1000 may include a metal oxide material, such as a combination of any one or more of ITO, IZO, etc. The common layer 600 is spaced apart from the first layer 1000 to prevent new leakage paths from being generated and reduce the risk of mis-lighting of pixels.

In some embodiments, referring to FIG. 8, in a top view direction, a distance (a third distance L3) between an end point of the second sub-portion 725 farthest away from the first sub-portion 724 and the first portion 710 is greater than or equal to 0.2 μm, so as to reduce the probability of contact between the first layer 1000 and the common layer 600 when the first layer 1000 is a metal oxide, which prevents new leakage paths from being generated and reduces the risk of mis-lighting of pixels.

At the step S420*b*, referring to FIG. 7 and FIG. 8, a light emitting layer 400, formed on the substrate 210 and the pixel definition layer 300, includes a plurality of sub-film layers stacked. At least part of the sub-film layers of the light emitting layer 400 are disconnected at the partitions 700.

In some embodiments, according to different manufacturing processes, the step S400 may include:

S410*c*, referring to FIG. 15 and FIG. 16, forming a light emitting layer 400 on the substrate 210 and the pixel definition layer 300, wherein the light emitting layer 400 includes a plurality of sub-film layers stacked, and at least part of the sub-film layers of the light emitting layer 400 are disconnected at the partitions 700.

In some embodiments, the manufacturing method of the display panel 100 further includes steps of S500 and S600.

At the step S500, referring to FIG. 4, a cathode layer 920 is formed on the light emitting layer 400.

In some embodiments, referring to FIG. 4, the cathode layer 920 is arranged continuously.

In some embodiments, referring to FIG. 15, the cathode layer 920 is arranged to be spaced apart from the side of the second portion 720. By adjusting a thickness of the second portion 720, the cathode layer 920 may be disconnected at the side of the second portion 720. If the cathode layer 920 is required to be connected to the side of the second portion 720, the process parameters and the thickness of the second portion 720 need to be controlled, which will increase the process costs. Therefore, the thickness of the second portion 720 is not limited to reduce the costs, and the cathode layer 920 is arranged disconnected at the side of the second portion 720.

In some embodiments, referring to FIG. 2, the display panel 100 includes a plurality of pixels arranged corresponding to the light emitting areas A. The cathode layer 920 is arranged to be spaced apart from the side of the second portion 720. The second grooves G2 are correspondingly arranged around each of the pixels in a non-closed loop.

When the cathode layer 920 is disconnected at the side of the second portion 720, the corresponding second grooves G2 cannot be arranged in a closed loop around the pixel, so as to prevent the cathode layer 920 in the light emitting area A from becoming an island, and avoid a technical problem that the cathode signal is unable to be transmitted to the light emitting area A.

At the step S600, referring to FIG. 4, an encapsulation layer 800 is formed on the cathode layer 920.

In some embodiments, the encapsulation layer includes a first inorganic layer, a second inorganic layer, and an organic film layer between the first inorganic layer and the second inorganic layer.

In the present disclosure, partitions are provided in the non-light emitting area, the first portion of the partition is arranged in the second groove, the second portion of the partition is wider than the first portion, and the second portion of the partition is spaced apart from the pixel definition layer. It is beneficial for disconnection of at least part of the sub-film layers of the light emitting layer at the side of the second portion, thereby reducing the leakage paths of the leakage current and reducing the risk of mis-lighting of pixels. At the same time, the second grooves are arranged in the non-light emitting area, and the first portion of the partition is arranged in the second groove, which reduces an overall height of the partition, improves the leveling of organic film layers in the encapsulation layer, and improves the packaging performance, so that it may also ensure better package reliability while effectively improving the poor display caused by mis-lighting of pixels.

Figure 22:
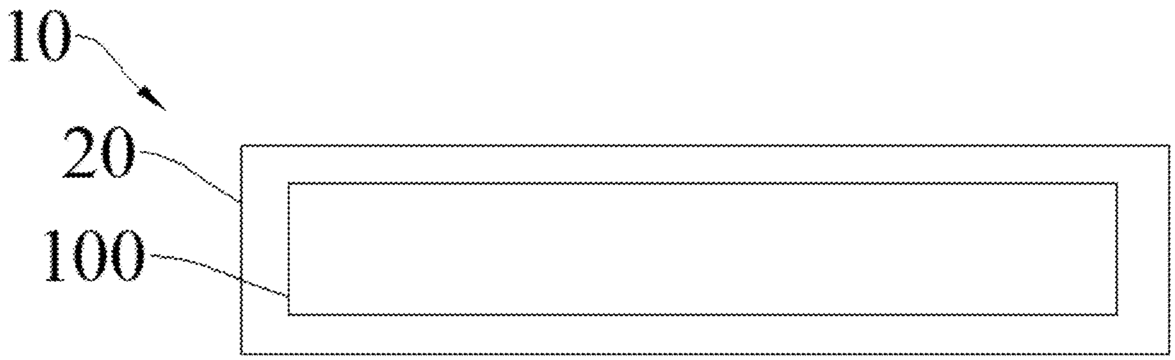
FIG. 22 is a schematic structural view of a display device provided according to an embodiment of the present disclosure.

Referring to FIG. 22, embodiments of the present disclosure also provide display devices 10 each including any one of the above-mentioned display panel 100.

The specific structure of the display panel 100 may be referred in any one of the above-mentioned embodiments and drawings of the display panels 100, which will not be repeated here.

In the embodiment, referring to FIG. 22, the display device 10 further includes a main body 20, and the main body 20 is integrated with the display panel 100.

In the embodiment, the main body 20 may include a middle frame, a frame glue, etc., and the display device 10 may be a display terminal such as a mobile phone, a tablet, a TV, etc., which is not limited here.

The embodiments of the present disclosure disclose display panels and display devices. The display panel includes light emitting areas and a non-light emitting area. The display panel includes a substrate, a pixel definition layer, a light emitting layer, and partitions. The pixel definition layer includes first grooves and second grooves arranged in the non-light emitting area. Each partition includes a first portion and a second portion connected with each other. The first portion corresponds to the second groove, a width of the second portion is greater than a width of the first portion, and the second portion is spaced apart from a surface of the pixel definition layer away from the substrate. In the present disclosure, the partitions are provided in the non-light emitting area, the first portion of the partition is arranged in the second groove, the second portion of the partition is wider than the first portion, and the second portion of the partition is spaced from the pixel definition layer. It is beneficial for at least part of the sub-film layers of the light emitting layer to be disconnected at the side of the second portion, thereby reducing the leakage paths of the leakage current and reducing the risk of mis-lighting of pixels.

It can be understood that those skilled in the art can make equivalent replacements or changes according to the technical solutions and inventive concepts of the present disclosure, and all these changes or replacements should fall within the protection scope of the appended claims of the present disclosure.

The invention claimed is:

1. A display panel, comprising a plurality of light emitting areas arranged at intervals and a non-light emitting area located between the light emitting areas, and comprising:

a substrate;

a pixel definition layer, disposed on a side of the substrate, and comprising first grooves correspondingly disposed in the light emitting areas and second grooves disposed in the non-light emitting area;

a plurality of partitions, disposed in the non-light emitting area and on a side of the pixel definition layer away from the substrate, wherein each of the partitions comprises a first portion disposed corresponding to one of the second grooves and a second portion disposed on a side of the first portion away from the substrate, a width of the second portion is greater than a width of the first portion, and the second portion is spaced apart from a surface of the pixel definition layer away from the substrate; and a light emitting layer, disposed on the side of the pixel definition layer and sides of the partitions away from the substrate, wherein the light emitting layer comprises pixels disposed corresponding to the first grooves, the light emitting layer comprises a plurality of sub-film layers stacked, and part of the sub-film layers of the light emitting layer are disconnected at the partitions;

wherein each of the partitions further comprises a third groove defined on a top surface of the second portion that faces away from the substrate, and the third groove is filled with at least part of the sub-film layers of the light emitting layer therein.

2. The display panel according to claim 1, wherein a sidewall of the first portion is arranged in direct contact with a sidewall of the pixel definition layer that forms a corresponding one of the second grooves.

3. The display panel according to claim 2, further comprising a first layer disposed in the non-light emitting area, wherein the first layer is disposed between the surface of the pixel definition layer away from the substrate and the second portion, and is disposed adjacent to the first portion.

4. The display panel according to claim 3, wherein an end of the light emitting layer at an interrupted position of the light emitting layer on a side of the partitions is spaced apart from the first layer.

5. The display panel according to claim 1, further comprising a first layer disposed in the non-light emitting area, wherein the first layer is disposed between a sidewall of the first portion and a sidewall of a corresponding one of the second grooves.

6. The display panel according to claim 5, wherein the first layer is further disposed between a bottom surface of the first portion and a bottom surface of the corresponding one of the second grooves.

7. The display panel according to claim 5, wherein the first layer further extends between the surface of the pixel definition layer away from the substrate and the second portion, and an end of the light emitting layer at an interrupted position of the light emitting layer on a side of the partitions is spaced apart from the first layer.

8. The display panel according to claim 1, wherein the light emitting layer comprises:

a first light emitting sublayer;

a second light emitting sublayer, disposed on a side of the first light emitting sublayer away from the substrate; and a charge generation layer, disposed between the first light emitting sublayer and the second light emitting sublayer; and wherein the charge generation layer is disconnected at the partitions.

9. The display panel according to claim 1, further comprising:

an anode layer, disposed on a side of the light emitting layer adjacent to the substrate; and a cathode layer, disposed on a side of the light emitting layer away from the substrate, wherein the cathode layer is disconnected at the partitions.

10. The display panel according to claim 1, further comprising:

a driving circuit layer, disposed between the substrate and the pixel definition layer; and a planarization layer, disposed between the driving circuit layer and the pixel definition layer, wherein each of the second grooves runs through the pixel definition layer, and a bottom of the first portion is arranged in direct contact with a top of the planarization layer.

11. The display panel according to claim 1, wherein the part of the sub-film layers of the light emitting layer are disconnected in the third groove.

12. The display panel according to claim 11, wherein the third groove runs through the second portion and the first portion.

13. The display panel according to claim 1, wherein the second portion comprises a first surface adjacent to the first portion and a second surface facing away from the first portion, and an orthographic projection of the first surface on the substrate is located within an orthographic projection of the second surface on the substrate.

14. The display panel according to claim 13, wherein an outer contour of the orthographic projection of the first surface on the substrate is spaced apart from an outer contour of the orthographic projection of the second surface on the substrate.

15. The display panel according to claim 1, wherein at least one of the second grooves is provided between two adjacent ones of the light emitting areas, and there is at least some of the second grooves each extending along a periphery of an adjacent one of the light emitting areas.

16. The display panel according to claim 15, wherein at least one of the pixels is surrounded by some of the second grooves arranged in a closed loop.

17. A display device, comprising the display panel of claim 1.

18. The display panel according to claim 1, wherein a first layer is provided in the non-light emitting area and is disposed between the pixel definition layer and each of the partitions, and an end of the light emitting layer at an interrupted position of the light emitting layer on a side of the partitions is spaced apart from the first layer.

19. The display panel according to claim 18, wherein the first layer is disposed between the surface of the pixel definition layer away from the substrate and the second portion, and is disposed adjacent to the first portion; or the first layer is disposed between a sidewall of the first portion and a sidewall of a corresponding one of the second grooves, and the first layer further extends between the surface of the pixel definition layer away from the substrate and the second portion.

20. The display panel according to claim 1, wherein at least one of the pixels is surrounded by some of the second grooves arranged in a closed loop.

* * * * *